US011765905B2

(12) United States Patent
Choi et al.

(10) Patent No.: US 11,765,905 B2
(45) Date of Patent: Sep. 19, 2023

(54) SEMICONDUCTOR MEMORY DEVICE

(71) Applicant: SAMSUNG ELECTRONICS CO., LTD., Suwon-si (KR)

(72) Inventors: Hyungeun Choi, Suwon-si (KR); Jong-ho Moon, Seoul (KR); Han-sik Yoo, Seongnam-si (KR); Kiseok Lee, Hwaseong-si (KR); Sung-hwan Jang, Bucheon-si (KR); Seungjae Jung, Suwon-si (KR); Euichul Jeong, Yongin-si (KR); Taehyun An, Seoul (KR); Sangyeon Han, Suwon-si (KR); Yoosang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 175 days.

(21) Appl. No.: 17/185,168

(22) Filed: Feb. 25, 2021

(65) Prior Publication Data
US 2022/0045079 A1    Feb. 10, 2022

(30) Foreign Application Priority Data

Aug. 7, 2020    (KR) .......................... 10-2020-0099201

(51) Int. Cl.
*H10B 43/40*    (2023.01)
*H01L 23/522*   (2006.01)
(Continued)

(52) U.S. Cl.
CPC ......... *H10B 43/40* (2023.02); *H01L 23/5226* (2013.01); *H01L 23/5283* (2013.01);
(Continued)

(58) Field of Classification Search
CPC .......... H01L 27/11573; H01L 23/5226; H01L 23/5283; H01L 27/11519; H01L 27/11526;
(Continued)

(56) References Cited

U.S. PATENT DOCUMENTS 8,846,494 B2    9/2014  Testa et al.
10,304,852 B1 *  5/2019  Cui ................... H01L 27/11565
(Continued)

FOREIGN PATENT DOCUMENTS

CN    109643700 A    4/2019
CN    110520984 A    11/2019
(Continued)

*Primary Examiner* — Shahed Ahmed
*Assistant Examiner* — Khatib A Rahman
(74) *Attorney, Agent, or Firm* — Sughrue Mion, PLLC

(57) ABSTRACT

A semiconductor memory device may include a peripheral circuit structure including peripheral circuits integrated on a semiconductor substrate in a first region and a first keypad disposed in a second region; a stack provided on the first region of the peripheral circuit structure, the stack including a plurality of first conductive lines extending in a first direction and are vertically stacked; an upper insulating layer covering the stack; an interconnection layer provided on the upper insulating layer; a penetration plug spaced apart from the stack and is provided to penetrate the upper insulating layer to connect the interconnection layer to the peripheral circuits of the peripheral circuit structure; a molding structure provided on the second region of the peripheral circuit structure and spaced apart from the stack in the first direction; and a penetration structure provided to penetrate the molding structure and vertically overlap with the first keypad.

20 Claims, 14 Drawing Sheets

(51) Int. Cl.
*H01L 23/528* (2006.01)
*H10B 41/10* (2023.01)
*H10B 41/20* (2023.01)
*H10B 41/40* (2023.01)
*H10B 43/10* (2023.01)
*H10B 43/20* (2023.01)

(52) U.S. Cl.
CPC ............ *H10B 41/10* (2023.02); *H10B 41/20* (2023.02); *H10B 41/40* (2023.02); *H10B 43/10* (2023.02); *H10B 43/20* (2023.02)

(58) Field of Classification Search
CPC ......... H01L 27/11551; H01L 27/11565; H01L 27/11578; H01L 27/11582; H01L 27/11575; H01L 21/76897; H10B 43/40; H10B 41/10; H10B 41/40; H10B 43/10; H10B 43/20; H10B 43/27; H10B 43/50; H10B 41/20
See application file for complete search history.

(56) References Cited

U.S. PATENT DOCUMENTS

| | | |
|---|---|---|
| 10,381,374 B2 | 8/2019 | Tagami et al. |
| 2011/0284946 A1 | 11/2011 | Kiyotoshi |
| 2017/0179028 A1 | 6/2017 | Lee et al. |
| 2019/0057898 A1 | 1/2019 | Shim et al. |
| 2020/0159133 A1 | 5/2020 | Yan et al. |
| 2020/0328176 A1 | 10/2020 | Liu |
| 2021/0134819 A1* | 5/2021 | Zhang ............... H01L 27/11548 |

FOREIGN PATENT DOCUMENTS

| | | |
|---|---|---|
| CN | 110914987 A | 3/2020 |
| CN | 110945652 A | 3/2020 |
| CN | 111295757 A | 6/2020 |
| KR | 1020200029326 A | 3/2020 |
| TW | 201005954 A1 | 2/2010 |
| TW | 201924030 A | 6/2019 |

* cited by examiner

SEMICONDUCTOR MEMORY DEVICE

CROSS-REFERENCE TO THE RELATED APPLICATION

This application is based on and claims priority under 35 U.S.C. § 119 to Korean Patent Application No. 10-2020-0099201, filed on Aug. 7, 2020, in the Korean Intellectual Property Office, the disclosure of which is incorporated by reference herein in its entirety.

BACKGROUND

The present disclosure relates to a semiconductor device, and in particular, to a highly-integrated three-dimensional semiconductor memory device.

Higher integration of semiconductor devices is required to satisfy consumer demands for superior performance and less expensive price. In the case of semiconductor devices, since their integration is an important factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, in order to achieve the finest pattern, it requires an extremely expensive process equipment to increase pattern fineness and sets a practical limitation on increasing integration for two-dimensional or planar semiconductor devices. To overcome such a limitation, three-dimensional semiconductor memory devices including three-dimensionally arranged memory cells have recently been proposed.

SUMMARY

One or more embodiments of the disclosure provide a highly-integrated semiconductor memory device.

In accordance with an exemplary embodiment, a semiconductor memory device includes: a peripheral circuit structure including peripheral circuits integrated on a semiconductor substrate in a first region and a first keypad disposed in a second region; a stack provided on the first region of the peripheral circuit structure, the stack including a plurality of first conductive lines extending in a first direction and are vertically stacked in a third direction that is perpendicular to the first direction; an upper insulating layer covering the stack; an interconnection layer provided on the upper insulating layer; a penetration plug spaced apart from the stack and is provided to penetrate the upper insulating layer to connect the interconnection layer to the peripheral circuits of the peripheral circuit structure; a molding structure provided on the second region of the peripheral circuit structure and spaced apart from the stack in the first direction; and a penetration structure provided to penetrate the molding structure and vertically overlap with the first keypad.

In accordance with an exemplary embodiment, a semiconductor memory device includes: a peripheral circuit structure including peripheral circuits integrated on a semiconductor substrate in a first region and a first keypad disposed in a second region that encloses the first region; a stack provided on the first region of the peripheral circuit structure, the stack including a plurality of first conductive lines extending in a first direction and are vertically stacked in a third direction that is perpendicular to the first direction; an upper insulating layer covering the stack; an interconnection layer provided on the upper insulating layer; a penetration plug provided on the first region of the peripheral circuit structure and spaced apart from the stack; a molding structure provided on the second region of the peripheral circuit structure and spaced apart from the stack in the first direction; and a penetration structure provided to penetrate the molding structure and vertically overlap with the first keypad, wherein an end of a lowermost one of the plurality of first conductive lines is spaced apart from the penetration structure and is closer to the penetration structure than an end of an uppermost one of the plurality of first conductive lines.

In accordance with an exemplary embodiment, a semiconductor memory device includes: a peripheral circuit structure including peripheral circuits integrated on a semiconductor substrate in a first region and a first keypad disposed in a second region that encloses the first region; a stack provided on the first region of the peripheral circuit structure, the stack including a plurality of first conductive lines extending in a first direction and are vertically stacked in a third direction that is perpendicular to the first direction; an upper insulating layer covering the stack; an interconnection layer provided on the upper insulating layer, the interconnection layer including a plurality of interconnection insulating layers, and a plurality of vias and a plurality of interconnection lines enclosed by the plurality of interconnection insulating layers; a penetration plug provided on the first region of the peripheral circuit structure and spaced apart from the stack; contacts provided on the plurality of first conductive lines of the stack and penetrating the upper insulating layer to connect the plurality of first conductive lines to the plurality of vias; a molding structure provided on the second region of the peripheral circuit structure and spaced apart from the stack in the first direction; a separation structure interposed between the molding structure and the upper insulating layer, the separation structure including an insulating pattern and an insulating liner enclosing the insulating pattern; and a penetration structure provided to penetrate the molding structure and vertically overlap with the first keypad, wherein an end of a lowermost one of the plurality of first conductive lines is spaced apart from the penetration structure in the first direction and is closer to the penetration structure than an end of an uppermost one of the plurality of first conductive lines.

BRIEF DESCRIPTION OF THE DRAWINGS

The above and other aspects, features, and advantages of certain embodiments of the disclosure will be more apparent from the following description taken in conjunction with the accompanying drawings. The accompanying drawings represent non-limiting, example embodiments as described herein.

DETAILED DESCRIPTION

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

For the sake of brevity, conventional elements to semiconductor memory devices may or may not be described in detail herein. However, even if a certain element is described or illustrated in a semiconductor device in this disclosure, the element may not be included in a claimed semiconductor memory device unless the element is recited as being included in the claimed semiconductor device.

Figure 1:
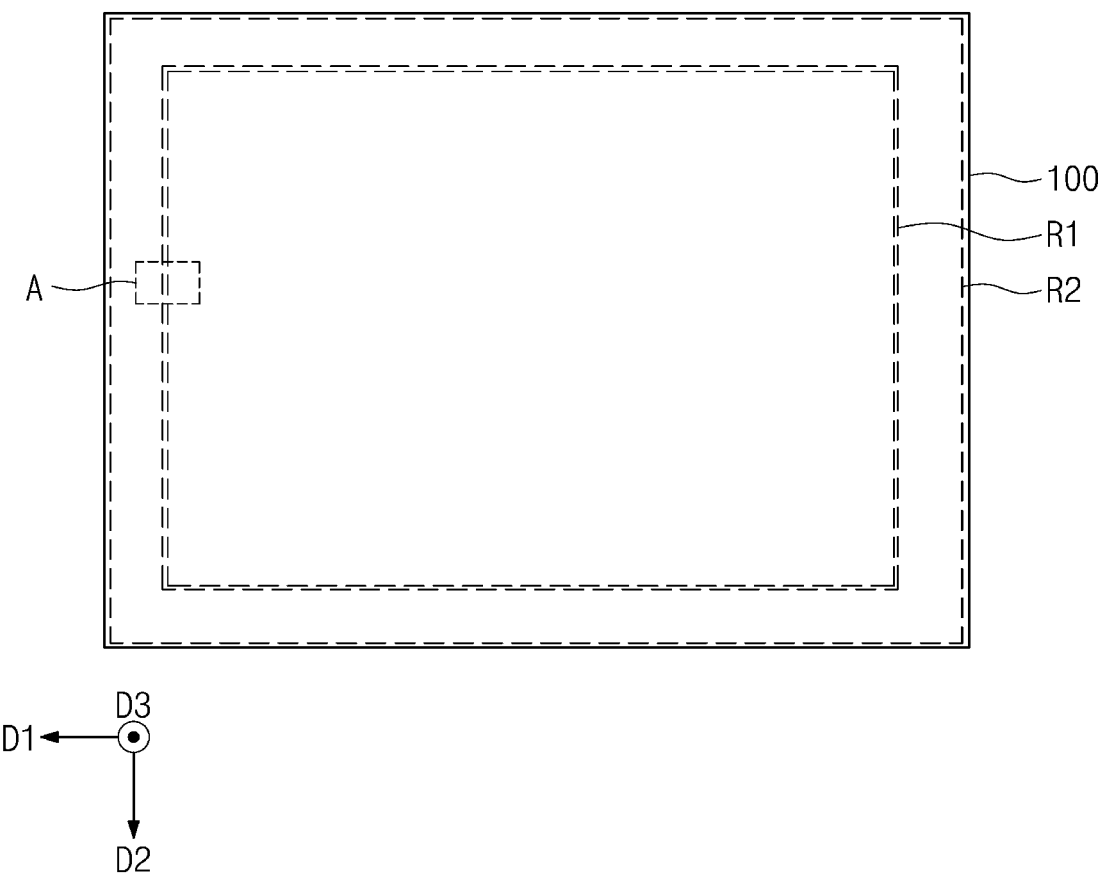
FIG. 1 is a plan view illustrating a semiconductor memory device according to an embodiment.
Figure 2:
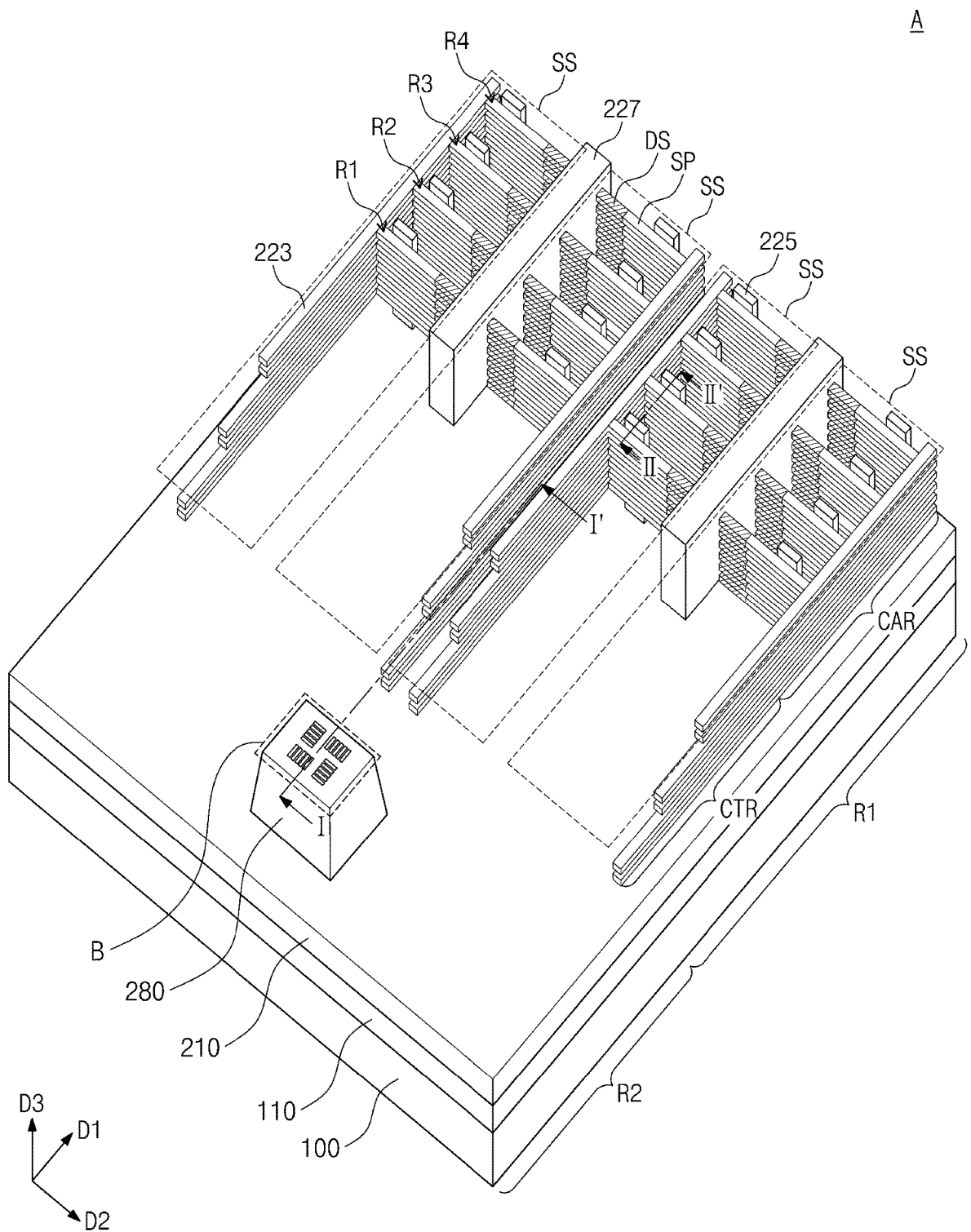
FIG. 2 is an enlarged perspective view illustrating a region A of FIG. 1 according to an embodiment.
Figure 3A:
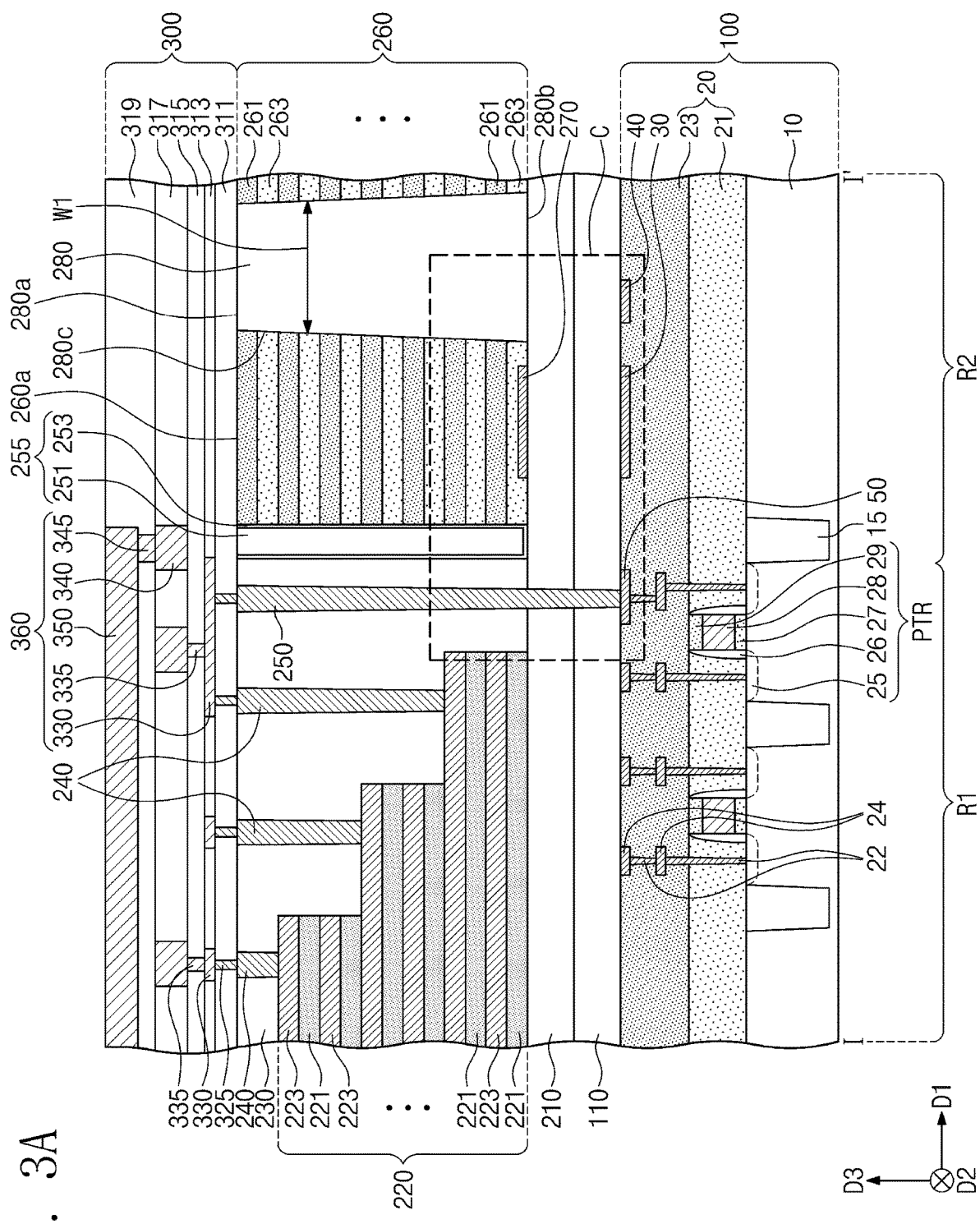
FIG. 3A is a cross-sectional view taken along a line I-I' of FIG. 2 according to an embodiment.
Figure 3B:
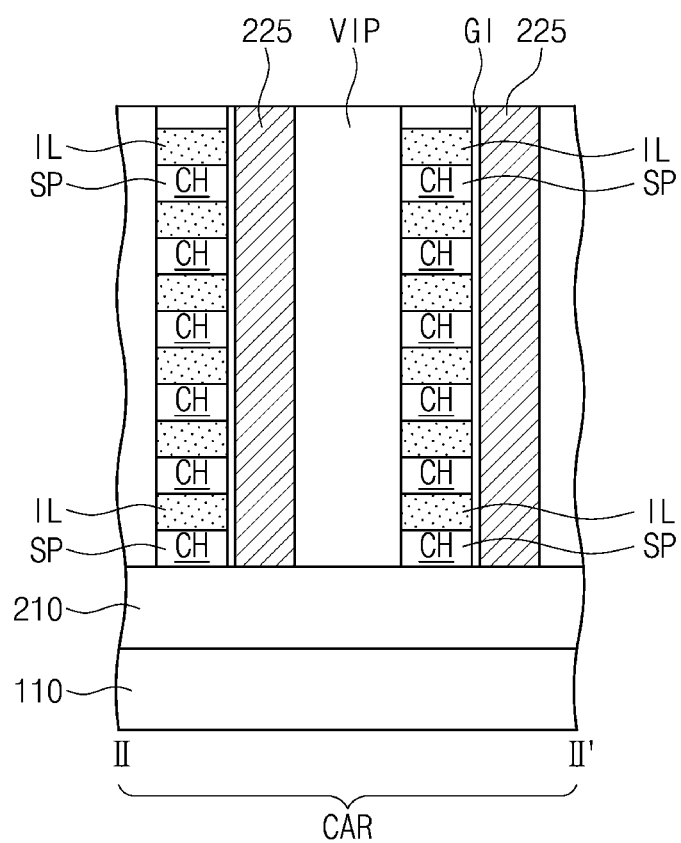
FIG. 3B is a cross-sectional view taken along a line II-IF of FIG. 2 according to an embodiment.
Figure 4:
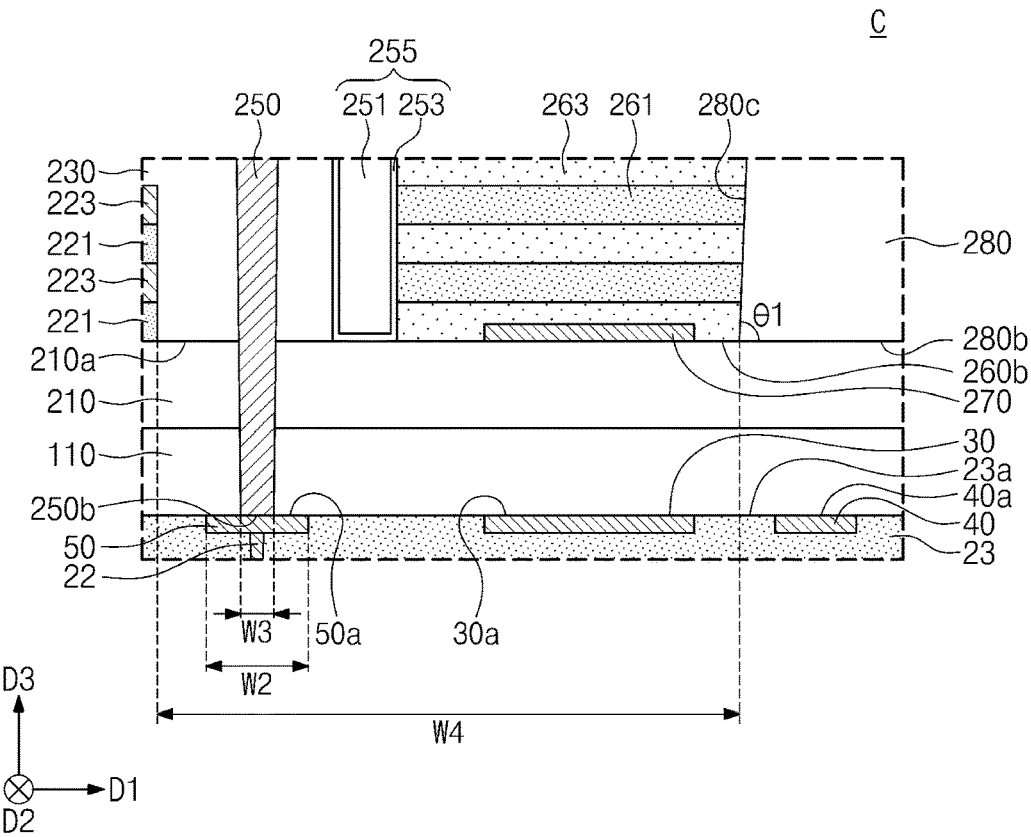
FIG. 4 is an enlarged cross-sectional view illustrating a region C of FIG. 2 according to an embodiment.
Figure 5:
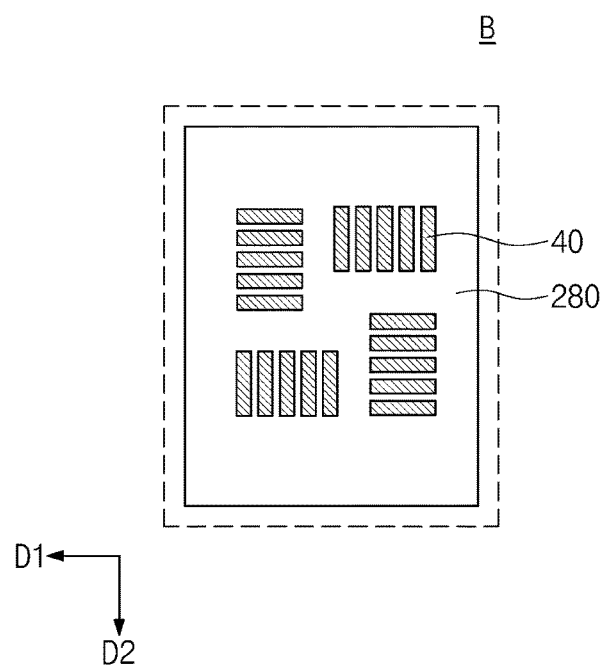
FIG. 5 is an enlarged plan view illustrating a region B of FIG. 2 according to an embodiment.

FIG. 1 is a plan view illustrating a semiconductor memory device according to an embodiment. FIG. 2 is an enlarged perspective view illustrating a region A of FIG. 1 according to an embodiment. FIG. 3A is a cross-sectional view taken along a line I-I' of FIG. 2 according to an embodiment. FIG. 3B is a cross-sectional view taken along a line II-IF of FIG. 2 according to an embodiment. FIG. 4 is an enlarged sectional view illustrating a region C of FIG. 2 according to an embodiment.

Referring to FIGS. 1, 2, 3A, and 3B, a peripheral circuit structure 100 may include a first region R1 and a second region R2. The peripheral circuit structure 100 may include a semiconductor substrate 10, a peripheral insulating layer 20, peripheral circuits PTR, peripheral vias 22, peripheral lines 24, and a first keypad 40.

The first region R1 may be a center region of the semiconductor device, and the second region R2 may be an edge region of the semiconductor device. The second region R2 may enclose the first region R1. The first region R1 may be a region, in which the peripheral circuits PTR are disposed. The peripheral circuits PTR may not be disposed in the second region R2. As an example, the first region R1 and the second region R2 may be separated from each other by a separation structure 255.

The semiconductor substrate 10 may be a silicon substrate, a silicon germanium substrate, a germanium substrate, or a single crystalline epitaxial layer grown on a single crystalline silicon substrate. The semiconductor substrate 10 may have active regions, which are defined by a device isolation pattern 15.

The peripheral circuits PTR may be provided on the semiconductor substrate 10. The peripheral circuits PTR may be provided on the first region R1, but not on the second region R2. Each of the peripheral circuits PTR may include peripheral source/drain regions 25, a peripheral gate spacer 26, a peripheral gate insulating layer 27, a peripheral gate electrode 28, and a peripheral capping pattern 29. The peripheral gate insulating layer 27 may be provided between the peripheral gate electrode 28 and the semiconductor substrate 10. The peripheral capping pattern 29 may be provided on the peripheral gate electrode 28. The peripheral gate spacer 26 may cover side surfaces of the peripheral gate electrode 28, the peripheral gate insulating layer 27, and the peripheral capping pattern 29. The peripheral source/drain regions 25 may be provided in portions of the semiconductor substrate 10, which are adjacent to both sides of the peripheral gate electrode 28. The peripheral lines 24 may be electrically connected to the peripheral circuits PTR through the peripheral vias 22. Each of the peripheral lines 24 and the peripheral vias 22 may be formed of or include at least one of conductive materials. For example, a conductive pad 50 may be formed of or include at least one of aluminum, copper, tungsten, and/or cobalt. The peripheral circuits PTR on the semiconductor substrate 10 may be, for example, NMOS transistors, PMOS transistors, or gate-all-around transistors.

The conductive pad 50 may be provided on the first region R1 of the peripheral circuit structure 100. More specifically, the conductive pad 50 may be disposed between a penetration plug 250 and the peripheral vias 22. The conductive pad 50 may be formed of or include at least one of conductive materials. For example, the conductive pad 50 may be formed of or include at least one of aluminum, copper, tungsten, and/or cobalt. The conductive pad 50 may be connected to the peripheral circuits PTR through the peripheral vias 22. The conductive pad 50 may be used to define a position at which the penetration plug 250 will be provided. The conductive pad 50 will be described in more detail below.

The peripheral insulating layer 20 may be provided on the semiconductor substrate 10. The peripheral insulating layer 20 may cover the peripheral circuits PTR, the peripheral vias 22, and the peripheral lines 24 on the semiconductor substrate 10. The peripheral insulating layer 20 may be formed of or include at least one of silicon oxide, silicon nitride, silicon oxynitride, and/or low-k dielectric materials. The peripheral insulating layer 20 may have a multi-layered structure, in which a plurality of insulating layers are stacked. For example, the peripheral insulating layer 20 may include a first peripheral insulating layer 21 and a second peripheral insulating layer 23. The second peripheral insulating layer 23 may be stacked on the first peripheral insulating layer 21. The first peripheral insulating layer 21 may cover the peripheral circuits PTR but may expose top surfaces of the peripheral capping patterns 29 of the peripheral circuits PTR. The second peripheral insulating layer 23 may be provided to cover a top surface of the first peripheral insulating layer 21 and the exposed top surfaces of the peripheral capping patterns 29. The second peripheral insulating layer 23 may be provided to enclose the peripheral lines 24 and the peripheral vias 22.

The first keypad 40 may be provided on the semiconductor substrate 10. More specifically, the first keypad 40 may be provided on the second peripheral insulating layer 23 and in the second region R2 of the peripheral circuit structure 100. A top surface of the first keypad 40 may be exposed from the second peripheral insulating layer 23. The first keypad 40 may be formed of or include at least one of metallic materials (e.g., aluminum, copper, tungsten, and/or cobalt). The first keypad 40 may be vertically overlapped with a penetration structure 280. That is, the first keypad 40 may be overlapping with the penetration structure 280 in a third direction D3.

The peripheral circuit structure 100 may further include a second lower keypad 30. The second lower keypad 30 may be provided on the second region R2 of the peripheral circuit structure 100. The second lower keypad 30 may be horizontally spaced apart from the first keypad 40. For example, the second lower keypad 30 may be interposed between the first keypad 40 and the conductive pad 50. The second lower keypad 30 may be provided on the second peripheral insulating layer 23. More specifically, side and bottom surfaces of the second lower keypad 30 may be covered with the second peripheral insulating layer 23. Moreover, a top surface of the second lower keypad 30 may be exposed from the second peripheral insulating layer 23. The top surface of the second lower keypad 30 may be coplanar with a top surface of the second peripheral insulating layer 23. The second lower keypad 30 may be vertically overlapped with a second upper keypad 270. That is, the second lower keypad 30 may be overlapping with the second upper keypad 270 in the third direction D3. The second lower keypad 30 may be formed of or include at least one of metallic materials (e.g., aluminum, copper, tungsten, and/or cobalt).

Buffer layers may be provided on a top surface of the peripheral circuit structure 100. The buffer layers may include a first buffer layer 110 and a second buffer layer 210. The first buffer layer 110 may be provided on the top surface of the peripheral circuit structure 100. More specifically, the first buffer layer 110 may cover the top surface of the second peripheral insulating layer 23, top surfaces of the peripheral lines 24, a top surface of the conductive pad 50, the top surface of the second lower keypad 30, and the top surface of the first keypad 40. The first buffer layer 110 may be formed of or include at least one of insulating materials. For example, the first buffer layer 110 may be formed of or include at least one of silicon nitride, silicon oxide, silicon oxynitride, and/or carbon-containing silicon nitride.

The second buffer layer 210 may be provided on a top surface of the first buffer layer 110. The second buffer layer 210 may have a bottom surface that is in contact with the top surface of the first buffer layer 110. The second buffer layer 210 may cover the top surface of the first buffer layer 110 and may cover a bottom surface of a stack 220, a bottom surface of an upper insulating layer 230, a bottom surface of the separation structure 255, a bottom surface of a molding structure 260, a bottom surface of the second upper keypad 270, and a bottom surface of the penetration structure 280. The second buffer layer 210 may be formed of or include the same material as the first buffer layer 110. In this case, there may be no observable interface between the second buffer layer 210 and the first buffer layer 110, unlike that illustrated in the drawings.

Referring to FIGS. 2, 3A, and 3B, unit cell structures SS may be provided on a top surface of the second buffer layer 210. The unit cell structures SS may be provided on the first region R1 of the peripheral circuit structure 100. The unit cell structures SS may be vertically spaced apart from the peripheral circuit structure 100 by the first buffer layer 110 and the second buffer layer 210 interposed therebetween. Each of the unit cell structures SS may include the stack 220, semiconductor patterns SP, insulating layers IL, data storing elements DS, second conductive lines 225, and third conductive lines 227, and here, the semiconductor patterns SP and the insulating layers IL may be alternately stacked on the second buffer layer 210.

The unit cell structures SS may include a cell region CAR and a contact region CTR. The cell region CAR may be a region, in which the semiconductor patterns SP are provided, and the contact region CTR may be a region, in which the semiconductor patterns SP are not provided.

The semiconductor patterns SP, which are vertically stacked (i.e., the third direction D3), may be vertically spaced apart from each other by the insulating layers IL. The insulating layer IL may be interposed between each pair of the semiconductor patterns SP that are vertically adjacent to each other. The insulating layers IL may include at least one of a silicon oxide layer, a silicon nitride layer, a silicon oxynitride layer, a carbon-containing silicon oxide layer, a carbon-containing silicon nitride layer, and/or a carbon-containing silicon oxynitride layer.

Each of the semiconductor patterns SP may be a line-, bar- or pillar-shaped pattern extending in a second direction D2. The semiconductor patterns SP may be formed of or include at least one of, for example, silicon, germanium, silicon germanium, or indium gallium zinc oxide (IGZO). Each of the semiconductor patterns SP may include a first impurity region, a second impurity region, and a channel region. The channel region may be disposed between the first impurity region and the second impurity region. The first impurity region and the second impurity region may be of a first conductivity type (e.g., an n-type). The channel region may not be doped with impurities or may be of a second conductivity type (e.g., a p-type) different from the first conductivity type.

The semiconductor patterns SP may be arranged in a first column R1 to a fourth column R4. Each of the first column R1 to the fourth column R4 may include the semiconductor patterns SP, which are vertically stacked and are vertically overlapped with each other. For example, the number of the semiconductor patterns SP in each of the first column R1 to the fourth column R4 may be six, as shown in the drawings, but the one or more embodiments are not limited thereto. The first column R1 to the fourth column R4 may be arranged to be spaced apart from each other in a first direction D1. The first direction D1 and the second direction D2 may be parallel to the top surface of the semiconductor substrate 10, but may not be parallel to each other. A third direction D3 may be a direction that is perpendicular to both the first direction D1 and the second direction D2.

Each of the unit cell structures SS may include the stack 220. The stack 220 may include first interlayer insulating layers 221 and first conductive lines 223, which are alternately stacked. The first conductive lines 223, which are vertically stacked, may be vertically spaced apart from each other by the first interlayer insulating layers 221. The first interlayer insulating layer 221 may be interposed between each pair of the first conductive lines 223, which are vertically adjacent to each other.

The first conductive lines 223 may be line- or bar-shaped patterns extending in the first direction D1. The first conductive lines 223 may extend from the cell region CAR of the unit cell structure SS to the contact region CTR.

Each of the first conductive lines 223 may be in direct contact with the semiconductor patterns SP. As an example, each of the first conductive lines 223 may be located at substantially the same level as the semiconductor patterns SP. Each of the first conductive lines 223 may be connected to the first impurity regions of the semiconductor patterns SP. The semiconductor patterns SP of the first column R1 to the fourth column R4 may extend from a corresponding one of the first conductive lines 223 in the second direction D2 while maintaining the same level as the corresponding one of the first conductive lines 223.

Referring to FIG. 2, each of the stacks 220 may have a stepwise structure on the contact region CTR of the unit cell structure SS. For example, one adjacent pair of the first conductive lines 223 may have the same length in the first direction D1, but the length of the topmost pair of the first conductive lines 223 may be shorter than the length of the bottommost pair the first conductive lines 223. Thus, ends of the bottommost pair of the first conductive lines 223 may be closer to the second region R2 of the peripheral circuit structure 100 than ends of the topmost pair of the first conductive lines 223.

As another example, a length of the first conductive lines 223, which are stacked on the contact region CTR, in the first direction D1 may decrease as a distance from the top surface of the second buffer layer 210 increases. For example, the length of the lowermost one of the first conductive lines 223 may be longer than the lengths of the remaining ones of the first conductive lines 223. The length of the uppermost one of the first conductive lines 223 may be shorter than the lengths of the remaining ones of the first conductive lines 223.

The first conductive lines 223 may be formed of or include at least one of conductive materials. For example, the conductive materials may include doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and metal-semiconductor compounds (e.g., tungsten silicide, cobalt silicide, titanium silicide, and so forth). The first interlayer insulating layers 221 may be formed of or include at least one of insulating materials. The insulating materials may include, for example, silicon oxide, silicon nitride, and/or silicon oxynitride.

Referring to FIGS. 3A and 3B, each of the unit cell structures SS may further include the data storing elements DS, which are vertically stacked. The data storing elements DS, which are vertically stacked, may be vertically spaced apart from each other by the insulating layers IL. Each of the data storing elements DS may extend from a corresponding one of the semiconductor patterns SP in the second direction D2.

Each of the data storing elements DS may be in direct contact with a corresponding one of the semiconductor patterns SP. As an example, each of the data storing elements DS may be located at substantially the same level as a corresponding one of the semiconductor patterns SP. Each of the data storing elements DS may be connected to the second impurity region of a corresponding one of the semiconductor patterns SP.

The second conductive lines 225 may be provided in the cell region CAR of each of the unit cell structures SS to penetrate the unit cell structures SS. Each of the second conductive lines 225 may be a pillar- or bar-shaped pattern, which extends in the third direction D3 that is perpendicular to the top surface of the peripheral circuit structure 100. The second conductive lines 225 may be arranged in the first direction D1. The second conductive lines 225 may be disposed to be respectively adjacent to the first column R1 to the fourth column R4 of the semiconductor patterns SP.

As an example, the first one of the second conductive lines 225 penetrating the unit cell structure SS may be adjacent to the side surfaces of the semiconductor patterns SP constituting the first column R1. The first one of the second conductive lines 225 may be vertically extended on the side surfaces of the semiconductor patterns SP constituting the first column R1. The second one of the second conductive lines 225 penetrating the unit cell structure SS may be adjacent to the side surfaces of the semiconductor patterns SP constituting the second column R2. The second one of the second conductive lines 225 may be vertically extended on the side surfaces of the semiconductor patterns SP constituting the second column R2. A vertical insulating pattern VIP may be interposed between the first one of the second conductive lines 225 and the semiconductor patterns SP of the second column R2. The vertical insulating pattern VIP may include a silicon oxide layer.

A gate insulating layer GI may be disposed between the second conductive line 225 and channel regions CH of the semiconductor patterns SP. The gate insulating layer GI may be formed of or include at least one of high-k dielectric materials, silicon oxide, silicon nitride, or silicon oxynitride and may have a single- or multi-layered structure. In an embodiment, the high-k dielectric materials may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate. The second conductive lines 225 may be formed of or include at least one of conductive materials, and the conductive materials may include doped semiconductor materials, conductive metal nitrides, metals, and metal-semiconductor compounds.

The third conductive lines 227 may be provided in the cell region CAR of the unit cell structure SS and extend in parallel with the stacks 220 in the first direction D1. The third conductive lines 227 may be formed of or include at least one of conductive materials, and the conductive material may be one of doped semiconductor materials, conductive metal nitrides, metals, and metal-semiconductor compounds. At least one of the third conductive lines 227 may be used as a common ground line described with reference to FIG. 1.

The upper insulating layer 230 may be provided on the top surface of the second buffer layer 210. The upper insulating layer 230 may be provided on the first region R1 of the peripheral circuit structure 100. The upper insulating layer 230 may cover the top surfaces and end portions of the stacks 220. The upper insulating layer 230 may be formed of or include at least one of insulating materials (e.g., silicon oxide, silicon nitride, and/or silicon oxynitride).

Contacts 240 may be in contact with the first conductive lines 223, and provided on the stack 220. The contacts 240 may penetrate the upper insulating layer 230 to electrically connect an interconnection layer 300 to the first conductive lines 223. The contacts 240 may be provided in the contact region CTR of the unit cell structure SS and on the stepwise structure of the stack 220. Thus, the levels of the bottom surfaces of the contacts 240 may be elevated as the distance decreases in the first direction D1 from one end of the cell region CAR. The contacts 240 may be formed of or include at least one of conductive materials. For example, the contacts 240 may be formed of or include at least one of aluminum, copper, tungsten, and/or cobalt.

The molding structure 260 may be provided on the second region R2 of the peripheral circuit structure 100. The molding structure 260 may include first layers 261 and second layers 263, which are alternately stacked. The first layers 261, which are vertically stacked, may be vertically spaced apart from each other by the second layer 263. More specifically, the second layer 263 may be interposed between each adjacent pair of the first layers 261. Each of the first layers 261 may be provided at the same level as a corresponding one of the first conductive lines 223 of the stack 220. Each of the second layers 263 may be respectively provided at the same levels as a corresponding one of the first interlayer insulating layers 221 of the stack 220. The first layers 261 and the second layers 263 may be formed of or include silicon. As an example, the first layers 261 may be silicon layers, and the second layers 263 may be silicon-germanium layers. A bottom surface of the molding structure 260 may be in contact with the top surface of the second buffer layer 210, and a top surface 260a of the molding structure 260 may be in contact with the interconnection layer 300.

The separation structure 255 may be interposed between the molding structure 260 and the upper insulating layer 230. The separation structure 255 may include an insulating pattern 251 and an insulating liner 253 enclosing the insulating pattern 251. The insulating pattern 251 and insulating liner 253 may be formed of or include at least one of insulating materials (e.g., silicon oxide, silicon nitride, and/or silicon oxynitride). The upper insulating layer 230 and the molding structure 260 may be horizontally spaced apart from each other, with the separation structure 255 interposed therebetween. Thus, the separation structure 255 may have opposite side surfaces, which are in contact with the upper insulating layer 230 and the molding structure 260, respectively. As another example, the separation structure 255 may serve as a boundary between the first region R1 and the second region R2 of the peripheral circuit structure 100. However, the separation structure 255 may be omitted.

The penetration plug 250 may be provided on the first region R1 of the peripheral circuit structure 100. The penetration plug 250 may penetrate the upper insulating layer 230, the second buffer layer 210, and the first buffer layer 110 and may connect the interconnection layer 300 to the peripheral circuit structure 100. More specifically, the penetration plug 250 may be in contact with the top surface of the conductive pad 50 of the peripheral circuit structure 100. As an example, the penetration plug 250 may be provided between the separation structure 255 and the stack 220. The penetration plug 250 may be spaced apart from the stack 220, and the upper insulating layer 230 may be interposed between the penetration plug 250 and the stack 220. The penetration plug 250 may be formed of or include the same material as the contacts 240. For example, the penetration plug 250 may be formed of or include at least one of aluminum, copper, tungsten, and/or cobalt.

The second upper keypad 270 may be provided on the top surface of the second buffer layer 210. The second upper keypad 270 may be provided on the second region R2 of the peripheral circuit structure 100. More specifically, the second upper keypad 270 may be interposed between the molding structure 260 and the second buffer layer 210. The top and side surfaces of the second upper keypad 270 may be covered with the molding structure 260, and the bottom surface of the second upper keypad 270 may not be covered with the molding structure 260. The bottom surface of the second upper keypad 270 may be coplanar with the bottom surface of the molding structure 260. The second upper keypad 270 may be spaced apart from the penetration structure 280. For example, the second upper keypad 270 may be disposed between the separation structure 255 and the penetration structure 280. The second upper keypad 270 may be formed of or include at least one of metallic materials (e.g., aluminum, copper, tungsten, and/or cobalt). The second upper keypad 270 may be vertically overlapped with the second lower keypad 30 of the peripheral circuit structure 100.

Referring further to FIGS. 2 and 3A, the penetration structure 280 may be provided on the top surface of the second buffer layer 210. The penetration structure 280 may be provided on the second region R2 of the peripheral circuit structure 100. The penetration structure 280 may be provided to penetrate the molding structure 260. Accordingly, a bottom surface 280b of the penetration structure 280 may be in contact with the top surface of the second buffer layer 210, and a top surface 280a of the penetration structure 280 may be in contact with a bottom surface of the interconnection layer 300. The top surface of the penetration structure 280 may be coplanar with the top surface of the molding structure 260. The penetration structure 280 may be shaped like a polygonal pillar vertically penetrating the molding structure 260. However, the structure of the penetration structure 280 is not limited thereto. The penetration structure 280 may have any shape that is suitable for penetrating the molding structure 260.

A side surface 280c of the penetration structure 280 may be inclined at an angle with respect to the top surface of the second buffer layer 210. A first angle θ1 between the side surface 280c of the penetration structure 280 and a top surface 210a of the second buffer layer 210 may be an acute angle. For example, the first angle θ1 may range from about 50° to 90°. A width W1 of the penetration structure 280 in the first direction D1 may decrease as the distance from the top surface of the second buffer layer 210 increases in the third direction D3. Thus, a width of the bottom surface 280b of the penetration structure 280 may be larger than a width of the top surface 280a of the penetration structure 280. The penetration structure 280 may be vertically overlapped with the first keypad 40 of the peripheral circuit structure 100.

The penetration structure 280 may be spaced apart from the stack 220. For example, a distance W4 from the stack 220 to the penetration structure 280 may range from about 1 μm to 10 μm. The distance W4 may be the shortest distance between the first conductive lines 223 and the penetration structure 280 (i.e., between the penetration structure 280 and an end portion of one of the first conductive lines 223 closest thereto).

Referring to FIGS. 3A and 4, the penetration plug 250 may be provided on a top surface 50a of the conductive pad 50. A bottom surface 250b of the penetration plug 250 may be in contact with the top surface 50a of the conductive pad 50. The penetration plug 250 may be vertically overlapped with the conductive pad 50. A width W3 of the bottom surface 250b of the penetration plug 250 in the first direction D1 may be smaller than a width W2 of the top surface 50a of the conductive pad 50 in the first direction D1. More specifically, a difference between the width W3 of the bottom surface 250b of the penetration plug 250 in the first direction D1 and the width W2 of the top surface 50a of the conductive pad 50 in the first direction D1 may be in a range of about 10 nm to 30 nm.

Referring to FIG. 4 in conjunction with FIG. 3A, the first keypad 40 may be provided on the second peripheral insulating layer 23. The side and bottom surfaces of the first keypad 40 may be covered with the second peripheral insulating layer 23. A top surface 40a of the first keypad 40 may not be covered with the second peripheral insulating layer 23 and may be coplanar with the second peripheral insulating layer 23. In an embodiment, a plurality of the first keypads 40 may be provided. For example, when viewed in a plan view, each of the first keypads 40 may be a rectangular shape, and some of the first keypads 40 may be aligned to each other in the first direction D1 or the second direction D2. However, the shape of the first keypads 40 is not limited to the illustrated rectangular shape in the drawings and may be variously changed to, for example, polygonal and/or circular shapes, and the arrangement of the first keypads 40 is not limited to the example illustrated in FIG. 4 and may be variously modified. The first keypads 40 may be vertically overlapped with the penetration structure 280. The first keypads 40 may be used as reference points for determining the position of the penetration plug 250 in a process of forming the penetration plug 250. The role of the first keypads 40 will be described in more detail with reference to a fabrication method described later.

Referring back to FIG. 2, the interconnection layer 300 may be provided on the stack 220, the upper insulating layer 230, the molding structure 260, and the penetration structure 280. The interconnection layer 300 may include contact vias 325, an interconnection structure 360, and first to fifth interconnection insulating layers 311, 313, 315, 317, and 319, respectively. The interconnection structure 360 may include first to third interconnection lines 330, 340, and 350, respectively, and first vias 335 and second vias 345.

The first interconnection insulating layer 311 may be provided on the top surfaces of the upper insulating layer 230 and the molding structure 260. The first interconnection insulating layer 311 may be provided on the first region R1 and the second region R2 of the peripheral circuit structure 100. More specifically the first interconnection insulating layer 311 may cover the top surface of the upper insulating layer 230, the top surfaces of the contacts 240, the top surface of the separation structure 255, the top surface of the molding structure 260, and the top surface 280a of the penetration structure 280.

The contact vias 325 may be respectively provided on the contacts 240 and the penetration plug 250. The contact vias 325 may be provided in the first interconnection insulating layer 311 to penetrate the first interconnection insulating layer 311. The contact vias 325 may be respectively coupled to the contacts 240 and the penetration plug 250 to connect the stack 220 to the interconnection layer 300.

The second interconnection insulating layer 313 may be provided on the first interconnection insulating layer 311. The second interconnection insulating layer 313 may cover the top surface of the first interconnection insulating layer 311. The first interconnection lines 330 may be provided in the second interconnection insulating layer 313. The first interconnection lines 330 may be in contact with the contact vias 325, and thus, the interconnection structure 360 may be connected to the contacts 240 and the penetration plug 250.

The third interconnection insulating layer 315 and the fourth interconnection insulating layer 317 may be provided on the first and second interconnection insulating layers 311 and 313. The third interconnection insulating layer 315 may cover the top surfaces of the first interconnection lines 330. The first vias 335 may be provided in the third interconnection insulating layer 315. The first vias 335 may be in contact with the first interconnection lines 330. The third interconnection insulating layer 315 may be formed of or include a material, which is different from the fourth interconnection insulating layer 317, and thus may be used as an etch stop layer during the formation of the interconnection layer 300.

The fourth interconnection insulating layer 317 may be provided on the third interconnection insulating layer 315. The fourth interconnection insulating layer 317 may cover the top surface of the third interconnection insulating layer 315. The second interconnection lines 340 may be provided in the fourth interconnection insulating layer 317. The second interconnection lines 340 may be in contact with the first vias 335.

The fifth interconnection insulating layer 319 may be provided on the second interconnection lines 340 and the fourth interconnection insulating layer 317. The second vias 345 and the third interconnection lines 350 may be provided in the fifth interconnection insulating layer 319. The third interconnection lines 350 may be connected to the second vias 345.

The contact vias 325, the first to third interconnection lines 330, 340, and 350, and the first to second vias 335 and 345 may be formed of or include at least one of metallic materials (e.g., aluminum, copper, tungsten, and/or cobalt). The first to fifth interconnection insulating layers 311, 313, 315, 317, and 319 may be formed of or include at least one of insulating materials (e.g., silicon oxide, silicon nitride, and/or silicon oxynitride). Unlike that illustrated in the drawings, there may be no observable interface between the first to fifth interconnection insulating layers 311, 313, 315, 317, and 319, but the one or more embodiments are not limited thereto.

FIGS. 6 to 13 are cross-sectional views illustrating a method of fabricating a semiconductor memory device according to an embodiment.

Figure 6:
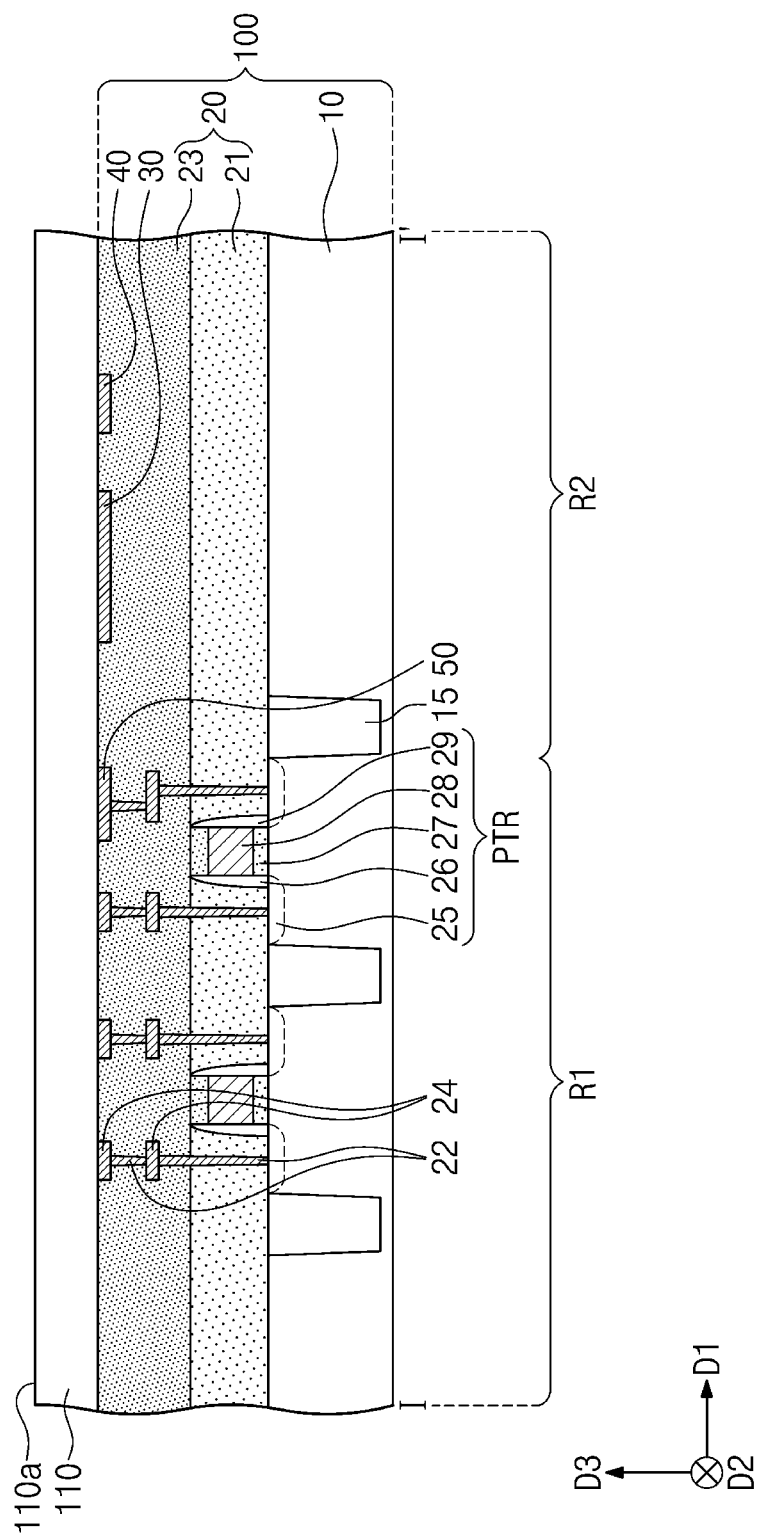
FIGS. 6 to 13 are cross-sectional views illustrating a method of fabricating a semiconductor memory device according to an embodiment.

Referring to FIG. 6, the peripheral circuit structure 100 may be formed. The formation of the peripheral circuit structure 100 may include preparing the semiconductor substrate 10, forming the peripheral circuits PTR on the semiconductor substrate 10, forming the peripheral vias 22 and the peripheral lines 24, which are connected to the peripheral circuits PTR, forming the peripheral insulating layer 20 to enclose the peripheral vias 22 and the peripheral lines 24, and forming the first keypad 40 and the second lower keypad 30 for which top surfaces are not covered with the peripheral insulating layer 20.

Here, the semiconductor substrate 10 may be formed of or include at least one of silicon (Si), germanium (Ge), silicon germanium (SiGe), gallium arsenic (GaAs), indium gallium arsenic (InGaAs), aluminum gallium arsenic (AlGaAs), or a combination thereof. The semiconductor substrate 10 may include at least one of doped semiconductor materials and/or undoped or intrinsic semiconductor materials, and may have one crystal structure of single crystalline, amorphous, and polycrystalline structures.

In an embodiment, the peripheral circuits PTR may include MOS transistors, in which the semiconductor substrate 10 is used as channel regions. As an example, the formation of the peripheral circuits PTR may include forming the device isolation pattern 15 in the semiconductor substrate 10 to define active regions, sequentially forming the peripheral gate insulating layer 27 and the peripheral gate electrode 28 on the semiconductor substrate 10, and performing an impurity injection process to form the source/drain regions 25 in the semiconductor substrate 10 at both sides of the peripheral gate electrode 28. The peripheral gate spacers 26 may be formed on the side surfaces of the peripheral gate electrode 28. The peripheral circuits PTR may be formed on the first region R1 of the peripheral circuit structure 100.

The peripheral insulating layer 20 may include a single insulating layer or a plurality of stacked insulating layers covering the peripheral circuits PTR. The peripheral insulating layer 20 may include, for example, a silicon oxide layer, a silicon nitride layer, a silicon oxynitride layer, and/or a low-k dielectric layer.

The first keypad 40 and the second lower keypad 30 may be formed on the top surface of the peripheral insulating layer 20. More specifically, the first keypad 40 and the second lower keypad 30 may be provided on the second region R2 of the peripheral circuit structure 100. The first keypad 40 and the second lower keypad 30 may be formed by forming trenches in the top surface of the peripheral insulating layer 20 and filling the trenches with a conductive material. The first keypad 40 and the second lower keypad 30 may be formed of or include at least one of metallic materials (e.g., aluminum, copper, tungsten, and/or cobalt).

The forming of the peripheral vias 22 and the peripheral lines 24 may include forming the peripheral vias 22 to penetrate portions of the peripheral insulating layer 20 and forming the peripheral lines 24 connected to the peripheral vias 22.

The first buffer layer 110 may be formed on the peripheral circuit structure 100. The first buffer layer 110 may be formed by depositing an insulating material. The first buffer layer 110 may be formed of or include at least one of silicon nitride, silicon oxide, silicon oxynitride, and/or carbon-containing silicon nitride.

Figure 7:
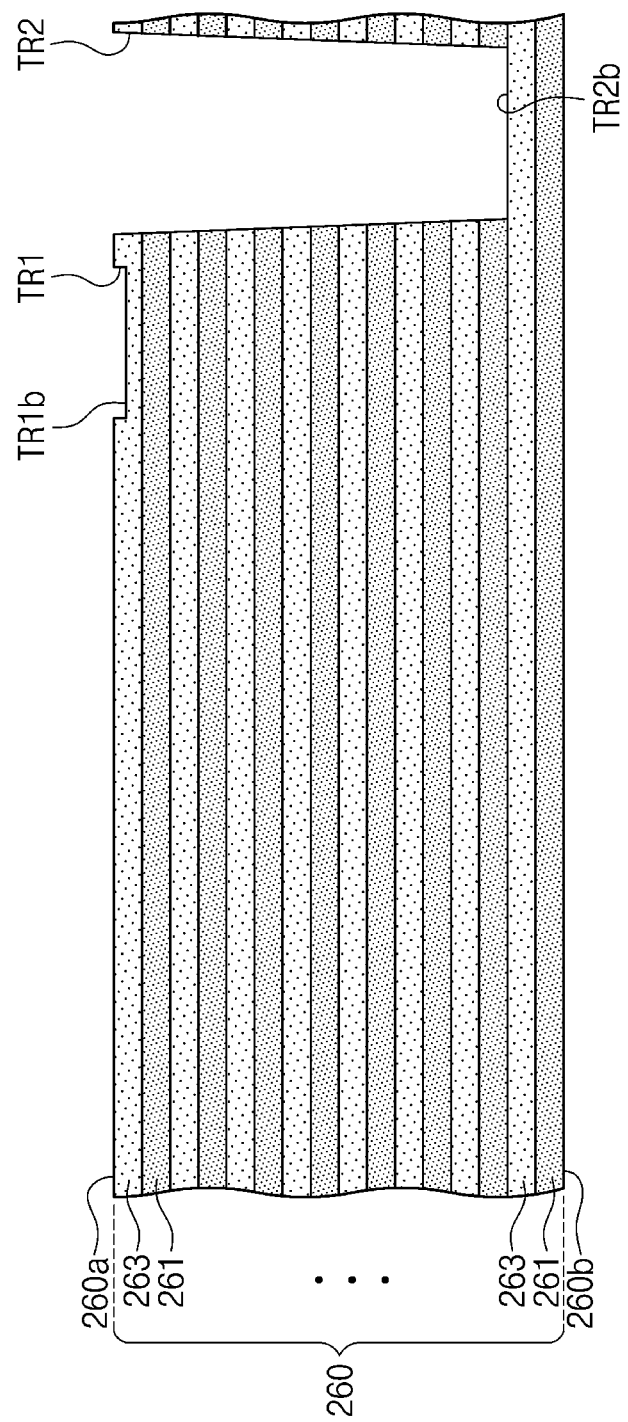

Referring to FIG. 7, the molding structure 260, in which the first layers 261 and the second layers 263 are alternately stacked, may be prepared. The molding structure 260 may be a silicon-containing substrate. More specifically, the first layers 261 of the molding structure 260 may be silicon layers, and the second layers 263 may be silicon-germanium layers. The molding structure 260 may have a first surface 260a and a second surface 260b, which are opposite from each other. The molding structure 260 may be etched to form a first trench TR1 and a second trench TR2. The first trench TR1 may be formed to be spaced apart from the second trench TR2. A depth of the first trench TR1 may be smaller than a depth of the second trench TR2. More specifically, a bottom surface TR1b of the first trench TR1 may be closer to the first surface 260a of the molding structure 260 than a bottom surface TR2b of the second trench TR2.

Figure 8:
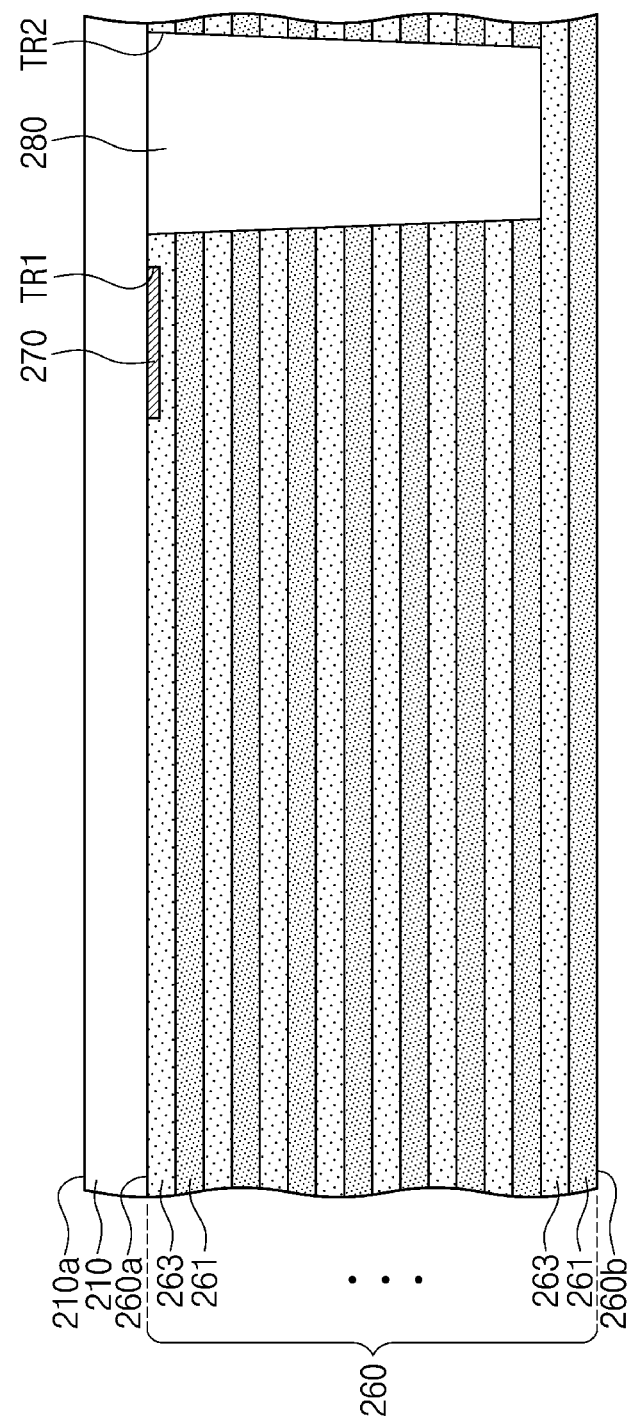

Referring to FIG. 8, the second upper keypad 270 may be formed by filling the first trench TR1 with a conductive material. The second upper keypad 270 may be formed of or include at least one of metallic materials (e.g., aluminum, copper, tungsten, and/or cobalt). The penetration structure 280 may be formed by filling the second trench TR2 with an insulating material. The insulating material for the penetration structure 280 may include silicon oxide, silicon nitride, and/or silicon oxynitride. A planarization process may be performed on the first surface 260a of the molding structure 260, and as a result, the top surface 260a of the molding structure 260, the top surface of the second upper keypad 270, and the top surface of the penetration structure 280 may be coplanar with each other. Thereafter, the second buffer layer 210 may be formed on the first surface 260a of the molding structure 260. The second buffer layer 210 may be formed using substantially the same method as that for forming the first buffer layer 110. The second buffer layer 210 may be formed to cover the first surface 260a of the molding structure 260, the second upper keypad 270, and the penetration structure 280 and may have a first surface 210a that is exposed to the outside.

Figure 9:
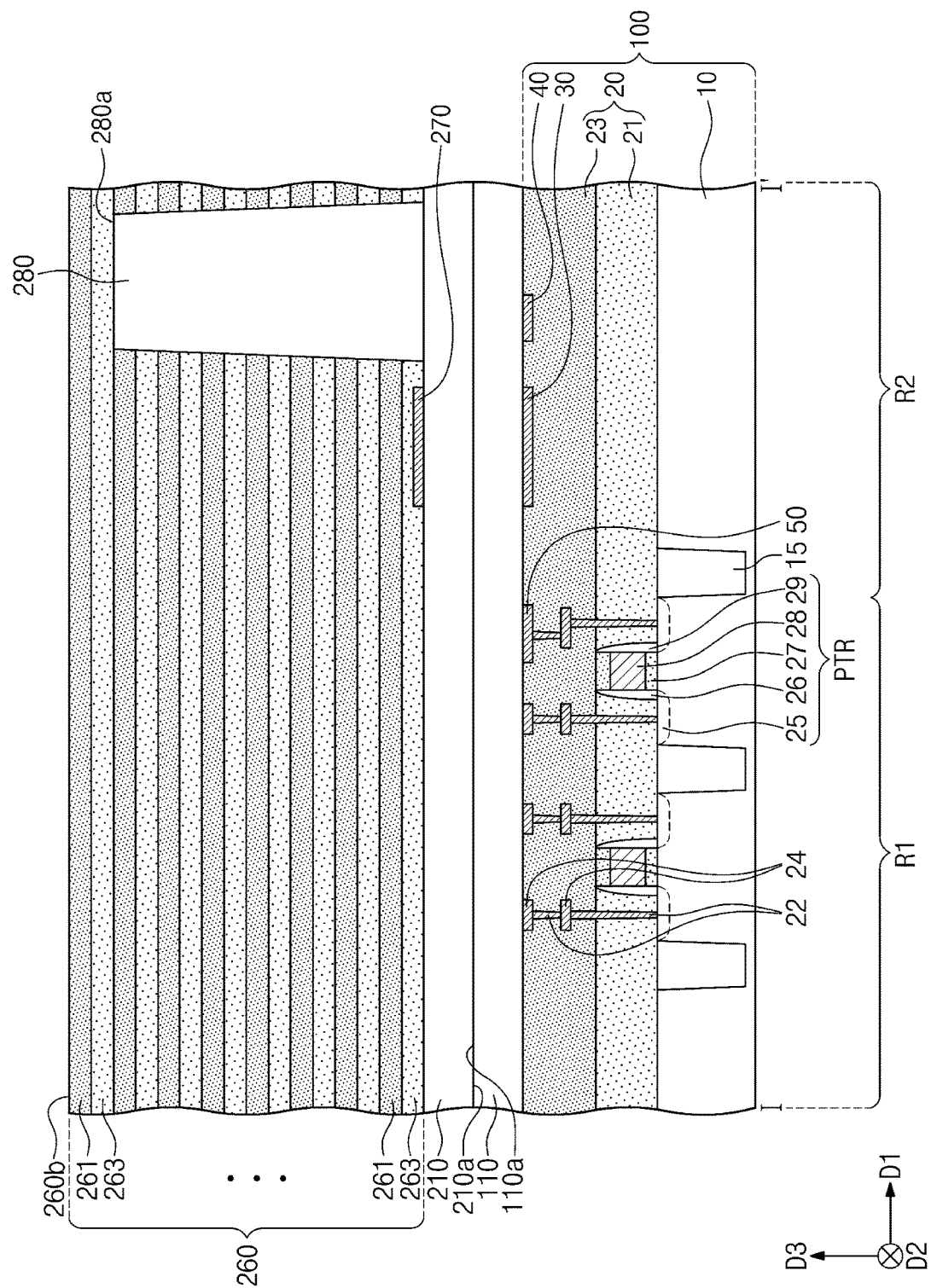

Referring to FIG. 9, the molding structure 260 may be fixedly placed on the peripheral circuit structure 100. The placing of the molding structure 260 on the peripheral circuit structure 100 may include providing the molding structure 260 on a top surface 110a of the first buffer layer 110 such that the second upper keypad 270 is vertically overlapping with the second lower keypad 30, and then performing a thermal treatment process to attach the first buffer layer 110 to the second buffer layer 210.

The molding structure 260, in which the second upper keypad 270 and the penetration structure 280 are formed, may be provided on the peripheral circuit structure 100. Here, the molding structure 260 may be placed such that the first surface 210a of the second buffer layer 210 faces the peripheral circuit structure 100. More specifically, positions of the second lower keypad 30 and the second upper keypad 270 may be examined, and then, the molding structure 260 may be placed such that the second upper keypad 270 is vertically overlapping with the second lower keypad 30. Accordingly, the second upper keypad 270 and the second lower keypad 30 may be vertically overlapped with each other, and preferably, aligned to each other in the third direction D3. The first surface 210a of the second buffer layer 210 may be in contact with the top surface 110a of the first buffer layer 110. The second upper keypad 270 and the second lower keypad 30 may be used as reference points for determining positions, at which the molding structure 260 will be provided.

The first buffer layer 110 and the second buffer layer 210 may be attached to each other, as a result of the thermal treatment process on the first buffer layer 110 and the second buffer layer 210. Thus, the molding structure 260 may be fastened or fixed to the peripheral circuit structure 100. As a result of the thermal treatment process, the first and second buffer layers 110 and 210 may be chemically or physically bonded to each other at an interface therebetween. The interface between the first and second buffer layers 110 and 210 may not be observable, unlike that illustrated in the drawings.

Figure 10:
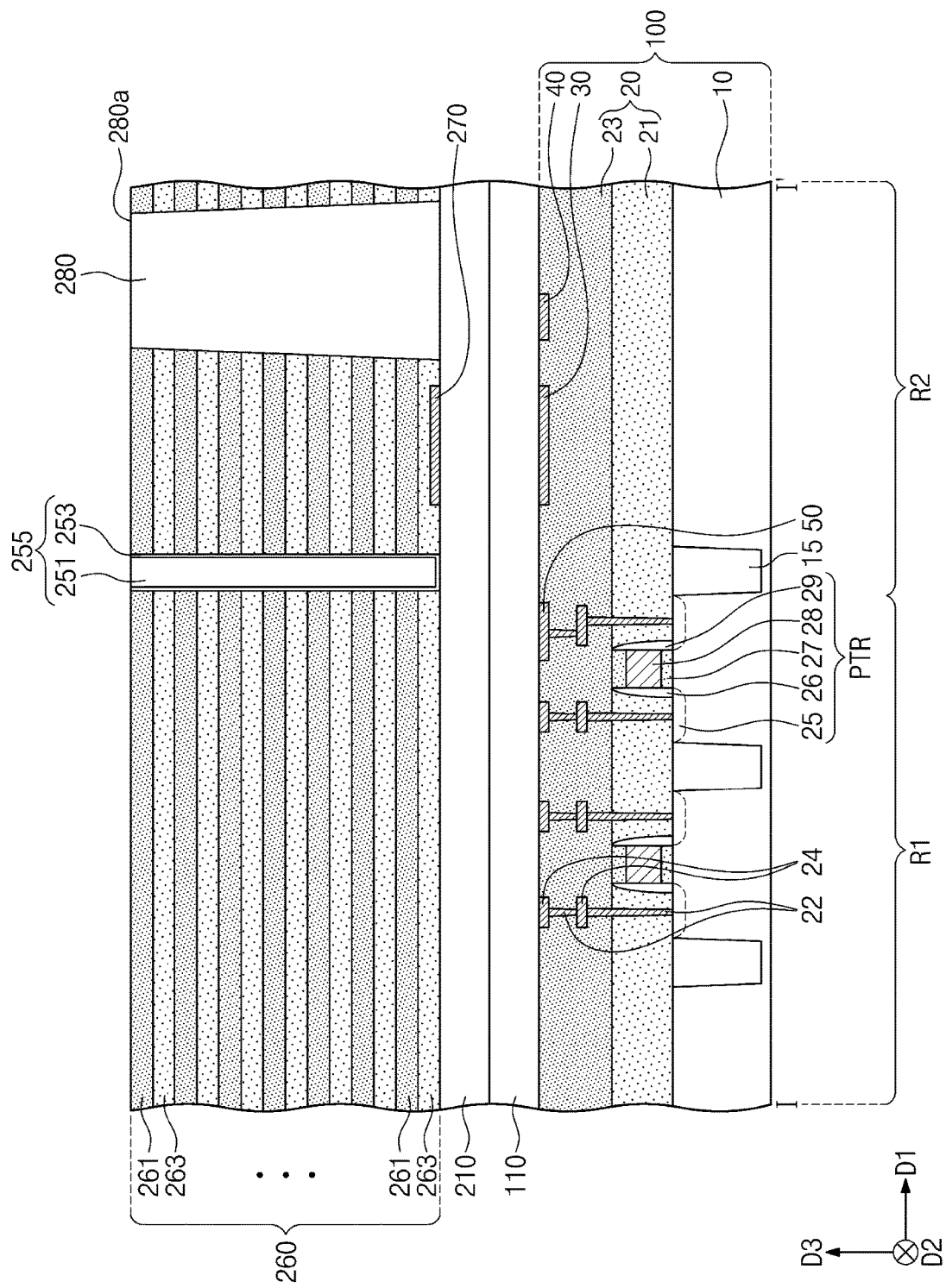

Referring to FIG. 10 in conjunction with FIG. 9, the separation structure 255 may be formed in the molding structure 260. The formation of the separation structure 255 may include forming a trench to penetrate the molding structure 260, forming the insulating liner 253 to cover an inner surface of the trench, and forming the insulating pattern 251 to fill the remaining portion of the trench. The insulating liner 253 and the insulating pattern 251 may be formed of or include at least one of insulating materials (e.g., silicon oxide, silicon nitride, and/or silicon oxynitride). The separation structure 255 may be formed on a boundary between the first region R1 and the second region R2 of the peripheral circuit structure 100. However, the one or more embodiments are not limited thereto, and the formation of the separation structure 255 may be omitted.

An etching process may be performed on the second surface 260b of the molding structure 260 to remove an upper portion of the molding structure 260 and an upper portion of the separation structure 255. The etching process may be performed until the top surface 280a of the penetration structure 280 is exposed. Accordingly, the second surface 260b of the molding structure 260, the top surface of the separation structure 255, and the top surface of the penetration structure 280 may be coplanar with each other.

Figure 11:
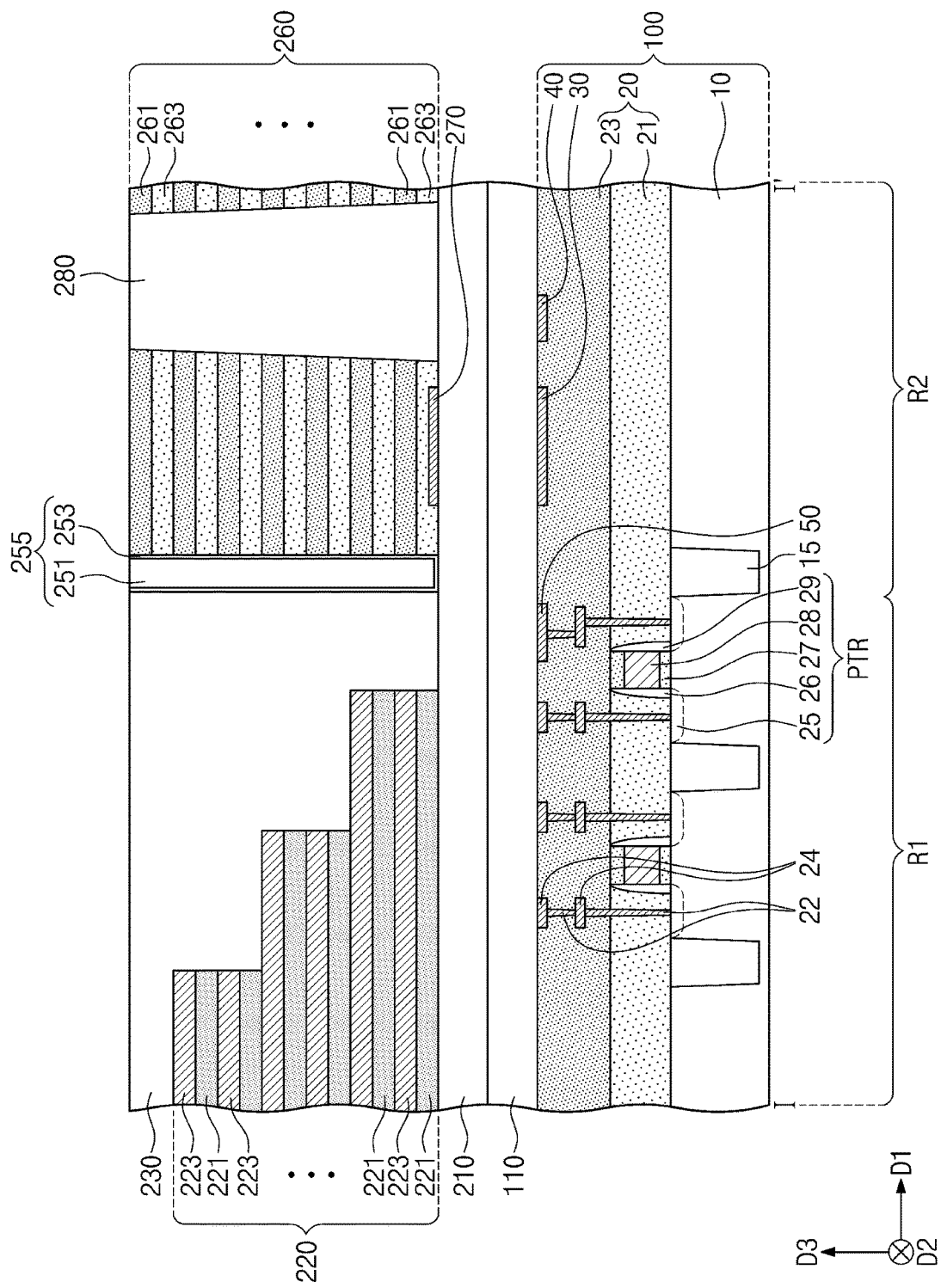

Referring to FIG. 11, the stack 220 may be formed on the first region R1 of the peripheral circuit structure 100. The formation of the stack 220 may include etching the molding structure 260 to form a preliminary stack, performing a replacement process on the preliminary stack to form the stack 220, and forming the upper insulating layer 230 to cover the stack 220.

The molding structure 260 may be etched to form the preliminary stack. More specifically, the molding structure 260, which is provided on the first region R1 of the peripheral circuit structure 100, may be etched to form the preliminary stack in a stepwise structure. The preliminary stack may include the first layers 261 and the second layers 263, which are alternately stacked. The first layers 261 of the preliminary stack may be silicon layers, and the second layers 263 may be silicon-germanium layers.

The replacement process may include removing the first layers 261 of the preliminary stack to form first empty regions, filling the first empty regions with a conductive material to form the first conductive lines 223, removing the second layers 263 to form second empty regions, and filling the second empty regions with an insulating material to form the first interlayer insulating layers 221. In an embodiment, the conductive material may include at least one of doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and metal-semiconductor compounds (e.g., tungsten silicide, cobalt silicide, titanium silicide, and so forth). The insulating material may include at least one of silicon oxide, silicon nitride, and/or silicon oxynitride. As a result, the stack 220 may be formed.

The upper insulating layer 230 may be formed on the first region R1 of the peripheral circuit structure 100 to cover the stack 220. The upper insulating layer 230 may be formed by depositing an insulating material. The insulating material may include at least one of, for example, silicon oxide, silicon nitride, and/or silicon oxynitride. The upper insulating layer 230 may be formed to fill a region, from which the molding structure 260 is removed. More specifically, the upper insulating layer 230 may be formed to cover the top and side surfaces of the stack 220 and to fill a gap region between the separation structure 255 and the stack 220.

Figure 12:
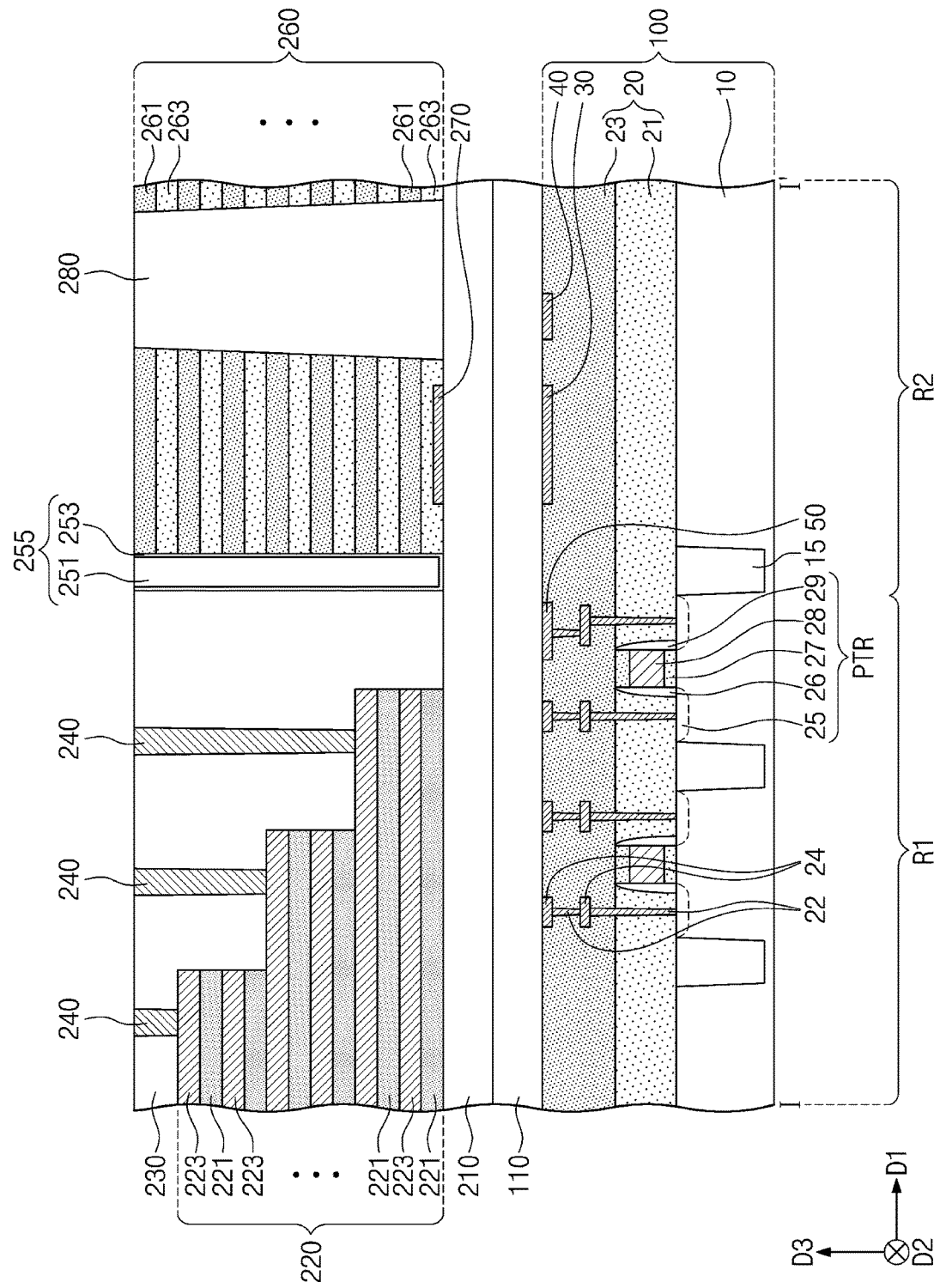

Referring to FIG. 12, the contacts 240 may be formed on the top surfaces of the first conductive lines 223 of the stack 220. The contacts 240 may be formed by forming penetration holes to penetrate the upper insulating layer 230 and filling the penetration holes with a conductive material. The penetration holes may be formed on the stepwise structure of the stack 220 to expose the top surfaces of the first conductive lines 223. The conductive material may include aluminum, copper, tungsten, and/or cobalt.

Figure 13:
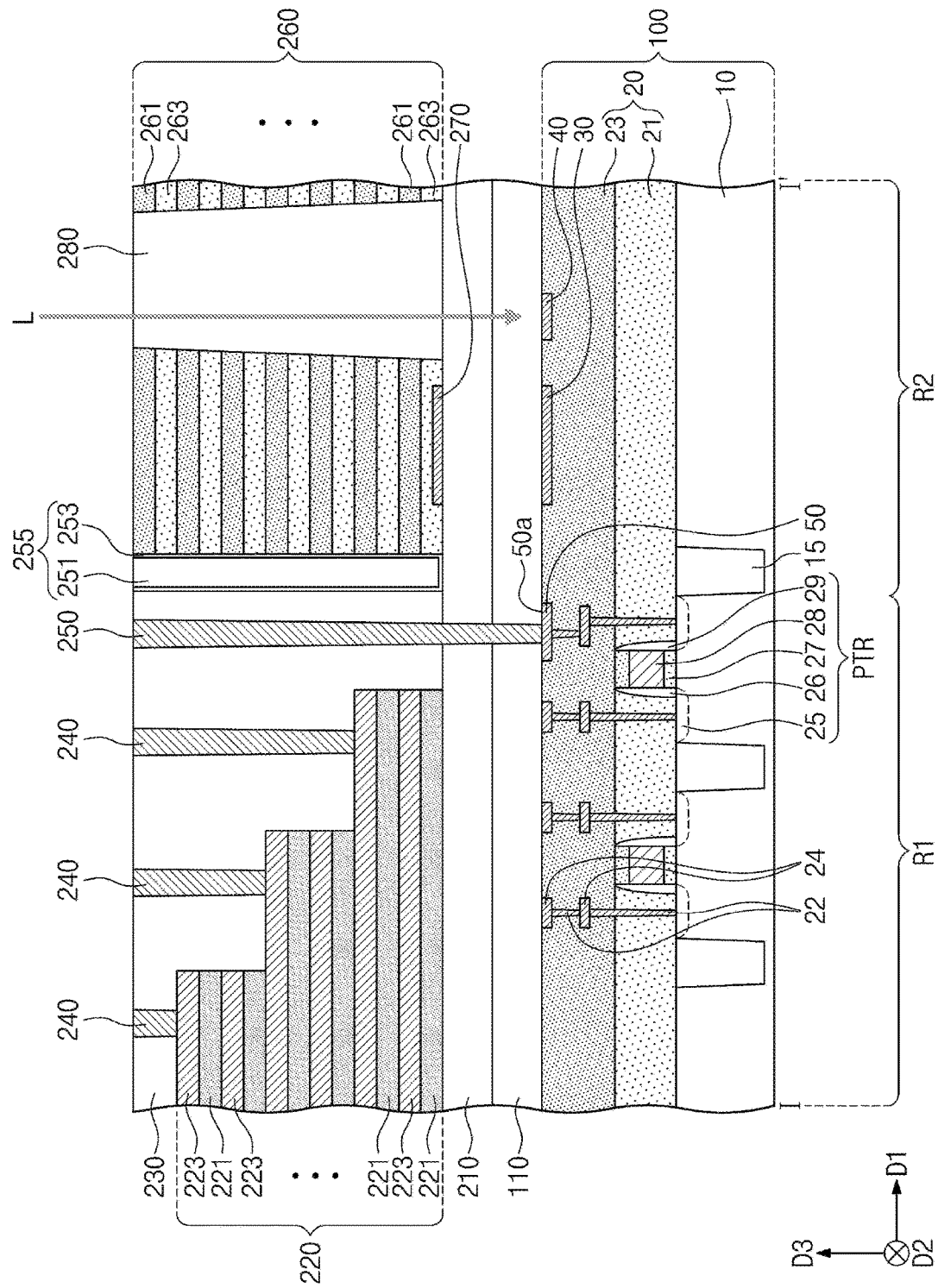

Referring to FIG. 13, the penetration plug 250 may be formed to penetrate the upper insulating layer 230, the second buffer layer 210, and the first buffer layer 110. The formation of the penetration plug 250 may include irradiating a first light L onto the top surface of the penetration structure 280 to obtain information on a position of the first keypad 40, forming a penetration hole at a position, at which the penetration plug 250 will be formed based on the information on the position of the first keypad 40, and filling the penetration hole with a conductive material to form the penetration plug 250.

More specifically, the first light L may be irradiated onto the top surface of the penetration structure 280. Transmittance of the penetration structure 280 to the first light L may be higher than transmittance of the molding structure 260 to the first light L. The first light L may be visible light, infrared light, and/or ultraviolet light, but the one or more embodiments are not limited to these examples. The position of the first keypad 40 may be examined using the first light L. The position of the first keypad 40 may be used to calculate the position for the penetration plug 250. Thereafter, the penetration hole for the penetration plug 250 may be formed at the calculated position. For example, the calculated position may be a position, at which the conductive pad 50 is formed. The penetration plug 250 may be formed by filling the penetration hole with a conductive material. The conductive materials may include at least one of aluminum, copper, tungsten, and/or cobalt.

In the case where a semiconductor device is fabricated by a method of sequentially forming or stacking a plurality of layers and a plurality of patterns, it may be possible to vertically align the patterns to each other more easily. By contrast, in the case where a semiconductor device is fabricated by a method of attaching an upper plate and a lower plate, which are independently prepared, to each other, it may be difficult to precisely align the upper plate to the lower plate. In particular, when patterns are formed to penetrate the upper and lower plates, it may be very difficult to precisely form the patterns, which pass through the upper plate, on a desired region (e.g., a landing pad) of the lower plate. To reduce these difficulties or a misalignment issue in the fabrication process, landing pads in contact with the penetrating patterns may be formed to have an increased width that is large enough to prevent a contact failure. However, if the width of the landing pad is increased, it is difficult to increase an integration density of the semiconductor device. According to an embodiment, the penetration structure 280 may be provided to be vertically overlapping with the first keypad 40. The peripheral circuit structure 100 and the stack 220 may be attached to each other using the second upper keypad 270 and the second lower keypad 30, and then, the position of the first keypad 40 may be examined using the first light L passing through the penetration structure 280. The position for the penetration plug 250 may be more precisely calculated, based on the examined position of the first keypad 40. Accordingly, it may be possible to reduce the width of the conductive pad 50 in contact with the penetration plug 250, and thereby, making it possible to increase the integration density of the semiconductor memory device.

Referring back to FIG. 3A, the interconnection layer 300 may be formed on the upper insulating layer 230, the molding structure 260, and the penetration structure 280. The formation of the interconnection layer 300 may include forming the contact vias 325, the interconnection structure 360, and the first to fifth interconnection insulating layers 311, 313, 315, 317, and 319. As a result, the semiconductor memory device may be fabricated to have the structure of FIG. 3A.

Figure 14:
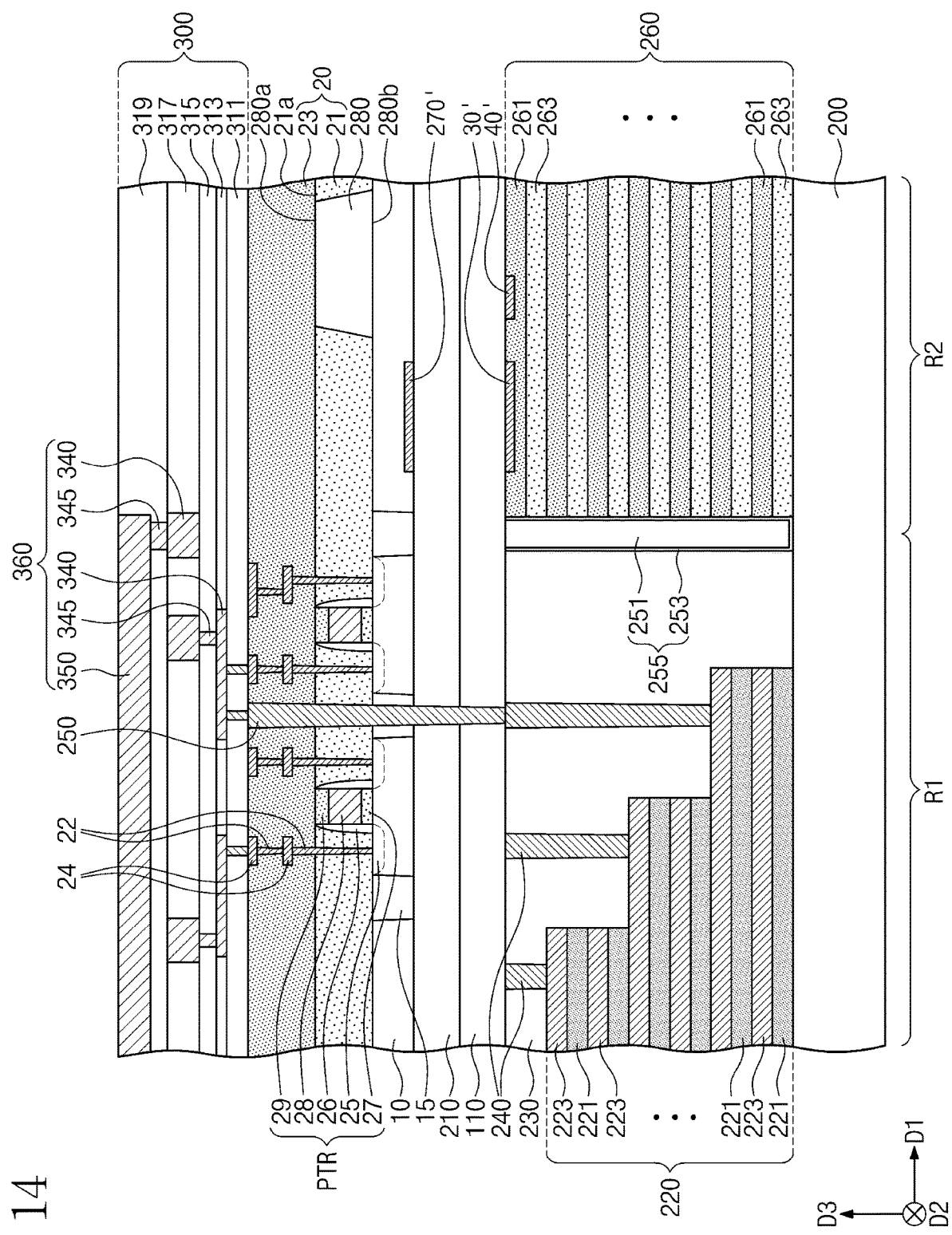
FIG. 14 is a cross-sectional view illustrating a semiconductor memory device taken along the line I-I' of FIG. 2 according to an embodiment.

FIG. 14 is a cross-sectional view illustrating a semiconductor memory device taken along the line I-I' of FIG. 2 according to an embodiment. In the following description, elements previously described with reference to FIGS. 1, 2, 3A, 3B, 4, and 5 may be identified by the same reference number without repeating an overlapping description thereof.

Referring to FIG. 14, a stack 220, contacts 240, an upper insulating layer 230, a separation structure 255, and a molding structure 260 may be provided on a second semiconductor substrate 200. The second semiconductor substrate 200 may be substantially the same as the semiconductor substrate 10 described with reference to FIGS. 1, 2, 3A, and 3B, and the stack 220, the contacts 240, the upper insulating layer 230, the separation structure 255, and the molding structure 260 may be configured to have substantially the same features as those described with reference to FIGS. 1, 2, 3A, and 3B.

The second semiconductor substrate 200 may have the first region R1 and the second region R2. The first and second regions R1 and R2 of the second semiconductor substrate 200 may be substantially the same as the first and second regions R1 and R2 of the peripheral circuit structure 100 described with reference to FIGS. 1, 2, 3A, and 3B.

A first buffer layer 110 may cover the top surface of the upper insulating layer 230, the top surface of the separation structure 255, the top surface of the molding structure 260, a top surface of a first keypad 40', and a top surface of a second lower keypad 30'. The first buffer layer 110 may include the same material as the first buffer layer 110 described with reference to FIGS. 1, 2, 3A, and 3B. A second buffer layer 210 may be provided on the top surface of the first buffer layer 110. The second buffer layer 210 may be formed of or include the same material as the first buffer layer 110.

The first keypad 40' and the second lower keypad 30' may be provided in an upper portion of the molding structure 260. More specifically, the first keypad 40' and the second lower keypad 30' may be provided on the second region R2 of the second semiconductor substrate 200. The molding structure 260 may cover bottom and side surfaces of the first keypad 40' and bottom and side surfaces of the second lower keypad 30'. Here, the top surfaces of the first keypad 40' and the second lower keypad 30' may not be covered with the molding structure 260 and may be in contact with the first buffer layer 110.

The first semiconductor substrate 10 may be provided on the top surface of the second buffer layer 210. The first semiconductor substrate 10 may be configured to have substantially the same features as the semiconductor substrate 10 described with reference to FIGS. 1, 2, 3A, and 3B. Peripheral circuits PTR, peripheral vias 22, peripheral lines 24, and the peripheral insulating layer 20 covering the peripheral circuits PTR may be provided on the first semiconductor substrate 10. The peripheral circuits PTR, the peripheral vias 22, the peripheral lines 24, and the peripheral insulating layer 20 may be configured to have substantially the same features as those in FIGS. 1, 2, 3A, and 3B.

A second upper keypad 270' may be provided in a lower portion of the first semiconductor substrate 10. The top surface and side surfaces of the second upper keypad 270' may be covered with the first semiconductor substrate 10. The bottom surface of the second upper keypad 270' may not be covered with the first semiconductor substrate 10 and may be in contact with the second buffer layer 210. The second upper keypad 270' may be vertically overlapped with the second lower keypad 30'.

The penetration structure 280 may be provided on the first semiconductor substrate 10. More specifically, the penetration structure 280 may be provided to penetrate a first peripheral insulating layer 21. The top surface of the penetration structure 280 may be coplanar with the top surface of the first peripheral insulating layer 21, and the bottom surface of the penetration structure 280 may be coplanar with the bottom surface of the first peripheral insulating layer 21. The side surface of the penetration structure 280 may be inclined at an angle with respect to the top surface of the first semiconductor substrate 10. As an example, a width of the top surface of the penetration structure 280 may be smaller than a width of the bottom surface of the penetration structure 280. The penetration structure 280 may be vertically overlapped with the first keypad 40'.

A penetration plug 250 may be provided to penetrate the peripheral insulating layer 20, the first buffer layer 110, and the second buffer layer 210 and may be connected to the contact 240. More specifically, the penetration plug 250 may electrically connect an interconnection structure 360 of an interconnection layer 300 to a first conductive line 223 of the stack 220.

The interconnection layer 300 may be formed on the peripheral insulating layer 20 and the peripheral lines 24. The interconnection layer 300 may be configured to have substantially the same features as the interconnection layer 300 in FIGS. 1, 2, 3A, and 3B. The interconnection structure 360 may be electrically connected to the peripheral lines 24.

According to an embodiment of the inventive concept, a semiconductor memory device may include a penetration structure, which is vertically overlapped with a first keypad. The first keypad may be used as a reference to precisely calculate a position, at which a penetration plug will be formed, and thus, it may be possible to reduce a width of a conductive pad in contact with the penetration plug. Accordingly, it may be possible to increase an integration density of a semiconductor memory device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:
a peripheral circuit structure including peripheral circuits integrated on a semiconductor substrate in a first region and a first keypad disposed in a second region;
a stack provided on the first region of the peripheral circuit structure, the stack comprising a plurality of first conductive lines extending in a first direction and are vertically stacked in a third direction that is perpendicular to the first direction;
an upper insulating layer covering the stack;
an interconnection layer provided on the upper insulating layer;
a penetration plug spaced apart from the stack and is provided to penetrate the upper insulating layer to connect the interconnection layer to the peripheral circuits of the peripheral circuit structure;
a molding structure provided on the second region of the peripheral circuit structure, spaced apart from the stack in the first direction, and a top surface of the molding structure being in direct contact with the interconnection layer; and
a penetration structure provided to penetrate the molding structure and vertically overlap with the first keypad,
wherein a width of the penetration structure in the first direction increases as a distance from the first keypad decreases in the third direction.

2. The semiconductor memory device of claim 1, further comprising:
a first buffer layer provided on a top surface of the peripheral circuit structure; and
a second buffer layer provided on a bottom surface of the stack,
wherein the first buffer layer and the second buffer layer are in contact with each other.

3. The semiconductor memory device of claim 2, wherein the penetration plug is provided to penetrate the second buffer layer and the first buffer layer.

4. The semiconductor memory device of claim 1, further comprising:
a second buffer layer covering a bottom surface of the stack and a bottom surface of the penetration structure; and
a second upper keypad interposed between the second buffer layer and the molding structure,
wherein the peripheral circuit structure further comprises a second lower keypad disposed on the second region of the peripheral circuit structure, and
the second upper keypad and the second lower keypad are vertically overlapping with each other.

5. The semiconductor memory device of claim 1, wherein the peripheral circuit structure further comprises a conductive pad in contact with a bottom surface of the penetration plug,
the bottom surface of the penetration plug has a first width,
the conductive pad has a second width, and
a difference between the first width and the second width ranges from about 10 nm to 30 nm.

6. The semiconductor memory device of claim 1, further comprising a second buffer layer covering a bottom surface of the penetration structure,
 wherein a side surface of the penetration structure is inclined at an angle with respect to a top surface of the second buffer layer.

7. The semiconductor memory device of claim 1, wherein the penetration structure comprises silicon oxide or silicon nitride.

8. The semiconductor memory device of claim 1, wherein a shortest distance from one of the plurality of first conductive lines to the penetration structure in the first direction ranges from about 1 μm to 10 μm.

9. The semiconductor memory device of claim 1, further comprising a separation structure interposed between the molding structure and the upper insulating layer.

10. The semiconductor memory device of claim 1, wherein the peripheral circuit structure further comprises a first peripheral insulating layer enclosing the peripheral circuits, and a second peripheral insulating layer provided on the first peripheral insulating layer, and
 a top surface of the first keypad is coplanar with a top surface of the second peripheral insulating layer.

11. A semiconductor memory device, comprising:
 a peripheral circuit structure including peripheral circuits integrated on a semiconductor substrate in a first region and a first keypad disposed in a second region that encloses the first region;
 a stack provided on the first region of the peripheral circuit structure, the stack comprising a plurality of first conductive lines extending in a first direction and are vertically stacked in a third direction that is perpendicular to the first direction;
 an upper insulating layer covering the stack;
 an interconnection layer provided on the upper insulating layer;
 a penetration plug provided on the first region of the peripheral circuit structure and spaced apart from the stack;
 a molding structure provided on the second region of the peripheral circuit structure, spaced apart from the stack in the first direction, and a top surface of the molding structure being in direct contact with the interconnection layer; and
 a penetration structure provided to penetrate the molding structure and vertically overlap with the first keypad,
 wherein an end of a lowermost one of the plurality of first conductive lines is spaced apart from the penetration structure and is closer to the penetration structure than an end of an uppermost one of the plurality of first conductive lines, and
 wherein a width of the penetration structure in the first direction increases as a distance from the first keypad decreases in the third direction.

12. The semiconductor memory device of claim 11, further comprising a buffer layer covering a bottom surface of the stack and a bottom surface of the upper insulating layer,
 wherein the penetration plug is provided to penetrate the upper insulating layer and the buffer layer to connect the interconnection layer to the peripheral circuits of the peripheral circuit structure.

13. The semiconductor memory device of claim 11, wherein the molding structure comprises a plurality of first layers and a plurality of second layers that are alternately stacked,
 each of the first layers comprises silicon, and
 each of the second layers comprises silicon-germanium.

14. The semiconductor memory device of claim 11, wherein the peripheral circuit structure further comprises a conductive pad in contact with a bottom surface of the penetration plug,
 the bottom surface of the penetration plug has a first width,
 the conductive pad has a second width, and
 a ratio of the first width to the second width ranges from about 0.5 to 0.8.

15. The semiconductor memory device of claim 11, further comprising a separation structure,
 wherein a side surface of the separation structure is in contact with the upper insulating layer, and
 another side surface of the separation structure is in contact with the molding structure.

16. The semiconductor memory device of claim 11, further comprising a buffer layer covering a bottom surface of the penetration structure,
 wherein the width of the penetration structure in the first direction decreases as a distance from the buffer layer increases in the third direction.

17. The semiconductor memory device of claim 11, further comprising:
 a buffer layer covering a bottom surface of the stack and a bottom surface of the penetration structure; and
 a second upper keypad interposed between the buffer layer and the molding structure,
 wherein the peripheral circuit structure further comprises a second lower keypad disposed in the second region of the peripheral circuit structure, and
 the second upper keypad and the second lower keypad are vertically overlapping with each other.

18. The semiconductor memory device of claim 11, wherein a top surface of the penetration structure is coplanar with a top surface of the molding structure.

19. A semiconductor memory device, comprising:
 a peripheral circuit structure including peripheral circuits integrated on a semiconductor substrate in a first region and a first keypad disposed in a second region that encloses the first region;
 a stack provided on the first region of the peripheral circuit structure, the stack comprising a plurality of first conductive lines extending in a first direction and are vertically stacked in a third direction that is perpendicular to the first direction;
 an upper insulating layer covering the stack;
 an interconnection layer provided on the upper insulating layer, the interconnection layer comprising a plurality of interconnection insulating layers, and a plurality of vias and a plurality of interconnection lines enclosed by the plurality of interconnection insulating layers;
 a penetration plug provided on the first region of the peripheral circuit structure and spaced apart from the stack;
 contacts provided on the plurality of first conductive lines of the stack and penetrating the upper insulating layer to connect the plurality of first conductive lines to the plurality of vias;
 a molding structure provided on the second region of the peripheral circuit structure, spaced apart from the stack in the first direction, and a top surface of the molding structure being in direct contact with the interconnection layer;
 a separation structure interposed between the molding structure and the upper insulating layer, the separation structure comprising an insulating pattern and an insulating liner enclosing the insulating pattern; and a penetration structure provided to penetrate the molding structure and vertically overlap with the first keypad, wherein an end of a lowermost one of the plurality of first conductive lines is spaced apart from the penetration structure in the first direction and is closer to the penetration structure than an end of an uppermost one of the plurality of first conductive lines, and wherein a width of the penetration structure in the first direction increases as a distance from the first keypad decreases in the third direction.

20. The semiconductor memory device of claim 19, further comprising:

peripheral vias and peripheral lines connected to the peripheral circuits, a second buffer layer covering a bottom surface of the stack and a bottom surface of the penetration structure;

a first buffer layer in contact with the second buffer layer and covering a top surface of the peripheral circuit structure; and a conductive pad vertically overlapping with the penetration plug.

\* \* \* \* \*